US010977412B2

(12) United States Patent
Chae et al.

(10) Patent No.: US 10,977,412 B2
(45) Date of Patent: Apr. 13, 2021

(54) INTEGRATED CIRCUIT INCLUDING LOAD STANDARD CELL AND METHOD OF DESIGNING THE SAME

(71) Applicant: Samsung Electronics Co., Ltd., Suwon-si (KR)

(72) Inventors: Kwan-Yeob Chae, Hwaseong-si (KR); Jong-Ryun Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 63 days.

(21) Appl. No.: 16/164,055

(22) Filed: Oct. 18, 2018

(65) Prior Publication Data
US 2019/0197214 A1 Jun. 27, 2019

(30) Foreign Application Priority Data
Dec. 26, 2017 (KR) .................. 10-2017-0179484

(51) Int. Cl.
*G06F 17/50* (2006.01)
*G06F 30/394* (2020.01)
*G06F 30/35* (2020.01)
*G06F 30/392* (2020.01)

(52) U.S. Cl.
CPC ............ *G06F 30/394* (2020.01); *G06F 30/35* (2020.01); *G06F 30/392* (2020.01)

(58) Field of Classification Search
USPC .................. 716/106, 108, 111, 113, 119
See application file for complete search history.

(56) References Cited

U.S. PATENT DOCUMENTS

| 5,459,673 | A | * | 10/1995 | Carmean | ............... G06F 30/327 716/113 |
| 5,631,492 | A | | 5/1997 | Ramus et al. | |
| 6,501,307 | B1 | * | 12/2002 | Yen | ....................... H03K 5/133 327/113 |
| 7,902,878 | B2 | | 3/2011 | Saint-Laurent et al. | |
| 8,188,780 | B2 | | 5/2012 | Pacha et al. | |
| 9,361,950 | B1 | | 6/2016 | Singh | |
| 9,479,154 | B2 | | 10/2016 | Matsuoka et al. | |
| 9,735,679 | B2 | | 8/2017 | Holzmann | |
| 9,741,719 | B2 | | 8/2017 | Smayling et al. | |
| 2002/0021159 | A1 | * | 2/2002 | Takahashi | .............. H03K 5/133 327/283 |
| 2005/0237848 | A1 | * | 10/2005 | Takahashi | .............. G11C 5/147 365/232 |
| 2006/0034142 | A1 | * | 2/2006 | Ooishi | ..................... G11C 8/10 365/230.06 |
| 2006/0091871 | A1 | * | 5/2006 | Abedinpour | .......... H02M 3/158 323/283 |

(Continued)

*Primary Examiner* — Brian Ngo
(74) *Attorney, Agent, or Firm* — Harness, Dickey & Pierce, P.L.C.

(57) ABSTRACT

To design an integrated circuit, input data defining an integrated circuit are received, and a plurality of load standard cells having different delay characteristics are provided in a standard cell library. Placement and routing are performed based on the input data and the standard cell library and output data defining the integrated circuit are generated based on a result of the placement and the routing. Design efficiency and performance of the integrated circuit are enhanced by designing the integrated circuit with delay matching and duty ratio adjustment using the load standard cell.

20 Claims, 25 Drawing Sheets

(56) References Cited

U.S. PATENT DOCUMENTS

| | | | |
|---|---|---|---|
| 2007/0133320 A1* | 6/2007 | Min | G11C 5/145 365/189.11 |
| 2007/0139973 A1* | 6/2007 | Leung | H02M 7/219 363/16 |
| 2007/0296479 A1* | 12/2007 | Takahashi | H03H 11/265 327/277 |
| 2008/0023792 A1 | 1/2008 | Liu et al. | |
| 2008/0148206 A1* | 6/2008 | Yamaguchi | G06F 30/392 716/113 |
| 2009/0212838 A1* | 8/2009 | Kim | H03K 5/133 327/285 |
| 2009/0256611 A1* | 10/2009 | Takahashi | G11C 7/1045 327/270 |

* cited by examiner

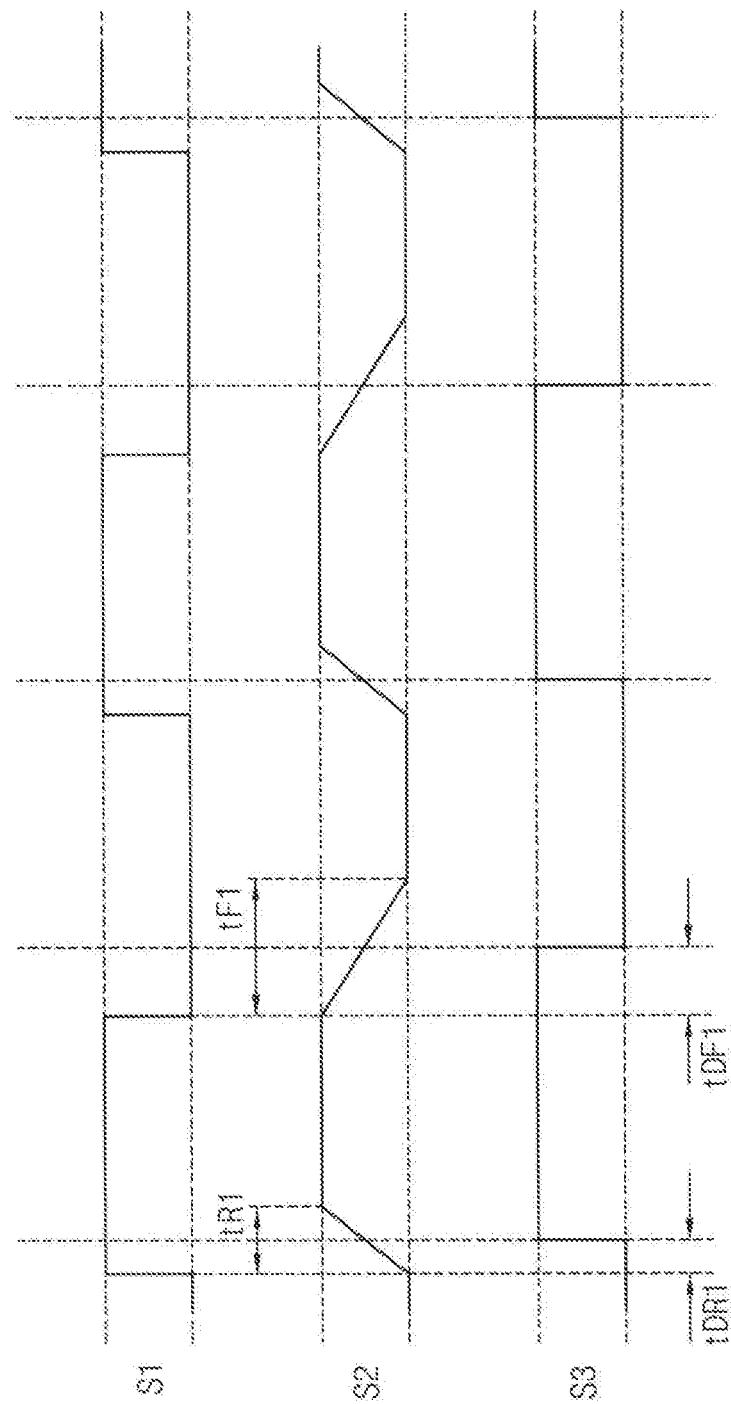

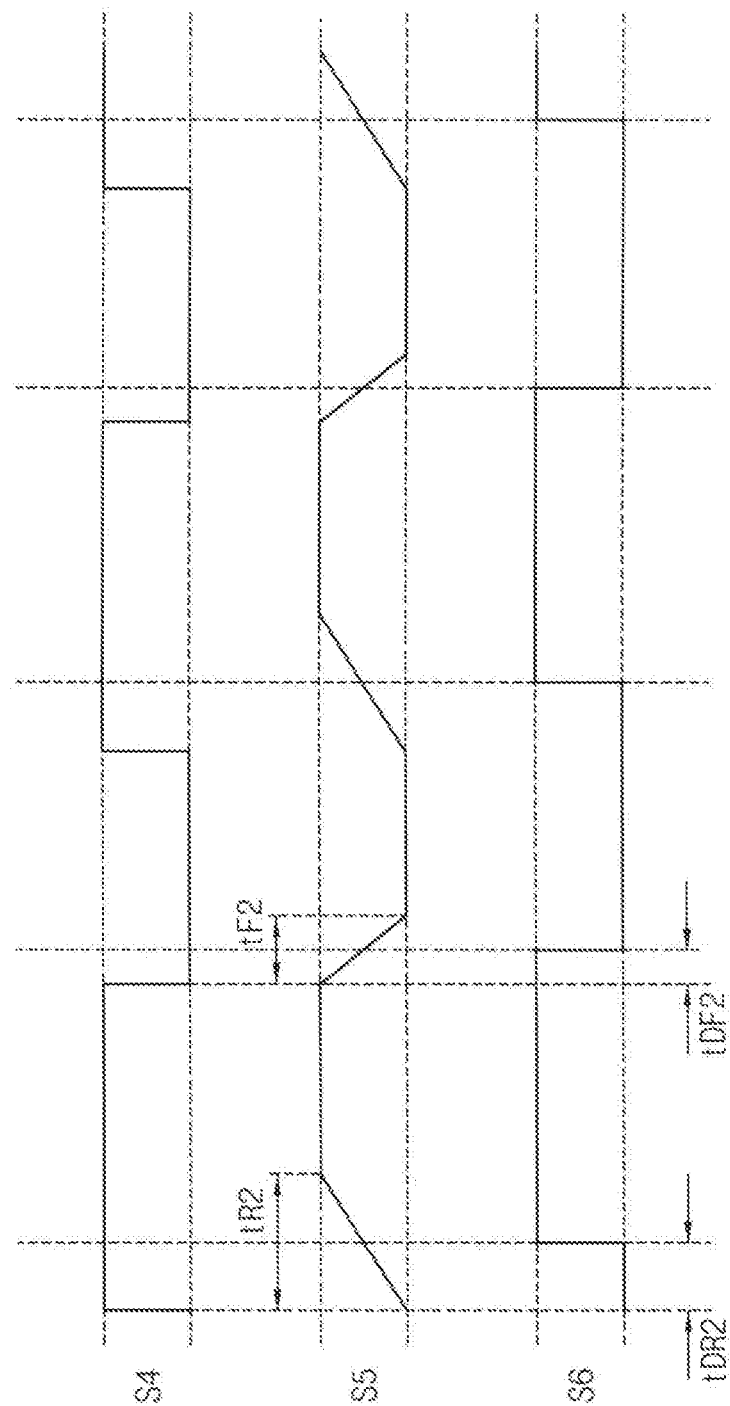

INTEGRATED CIRCUIT INCLUDING LOAD STANDARD CELL AND METHOD OF DESIGNING THE SAME

CROSS-REFERENCE TO RELATED APPLICATION

This U.S. Non-provisional application claims priority under 35 USC § 119 to Korean Patent Application No. 10-2017-0179484, filed on Dec. 26, 2017, in the Korean Intellectual Property Office (KIPO), the disclosure of which is incorporated by reference in its entirety herein.

BACKGROUND

Example embodiments relate generally to semiconductor integrated circuits, and more particularly to an integrated circuit including a signal-load cell and a method of designing the integrated circuit.

Standard cells having fixed functions may be used in the design of integrated circuits. The standard cells have predetermined architectures and are stored in cell libraries. When designing integrated circuits, the standard cells are retrieved from the cell libraries and placed into desired locations on an integrated circuit layout. Routing is then performed to connect the standard cells with each other and with other cells. A standard cell has a predetermined (or set) architecture that may include a cell width, a cell height, a power rail width, positions and numbers of pin points, etc. Design efficiency of an integrated circuit may be determined according to configurations of standard cells.

SUMMARY

Some example embodiments may provide an integrated circuit having an efficient signal delay and a method of designing an integrated circuit.

According to some example embodiments, a method of designing an integrated circuit includes, receiving input data defining an integrated circuit, providing, in a standard cell library, a plurality of load standard cells having different delay characteristics, performing placement and routing based on the input data and the standard cell library, and generating output data defining the integrated circuit based on a result of the placement and the routing.

According to some example embodiments, an integrated circuit includes a logic standard cell including a delay node requiring a delay, and a load standard cell including a load node that is connected to the delay node to provide the required delay.

According to some example embodiments, an integrated circuit includes a first logic standard cell including a first delay node, a second logic standard cell including a second delay node, a first load standard cell including a first load node providing a first delay, the first load node being connected to the first delay node and a second load standard cell including a second load node providing a second delay different from the first delay, the second load node connected to the second delay node.

The integrated circuit and the method of designing the integrated circuit according to some example embodiments may enhance design efficiency and performance of the integrated circuit by designing the integrated circuit with delay matching and duty ratio adjustment using the load standard cell.

BRIEF DESCRIPTION OF THE DRAWINGS

Example embodiments of the present disclosure will be more clearly understood from the following detailed description taken in conjunction with the accompanying drawings.

FIGS. 18A and 18B are timing diagrams illustrating operations of the integrated circuit of FIG. 17.

DETAILED DESCRIPTION OF EXAMPLE EMBODIMENTS

Figure 1:
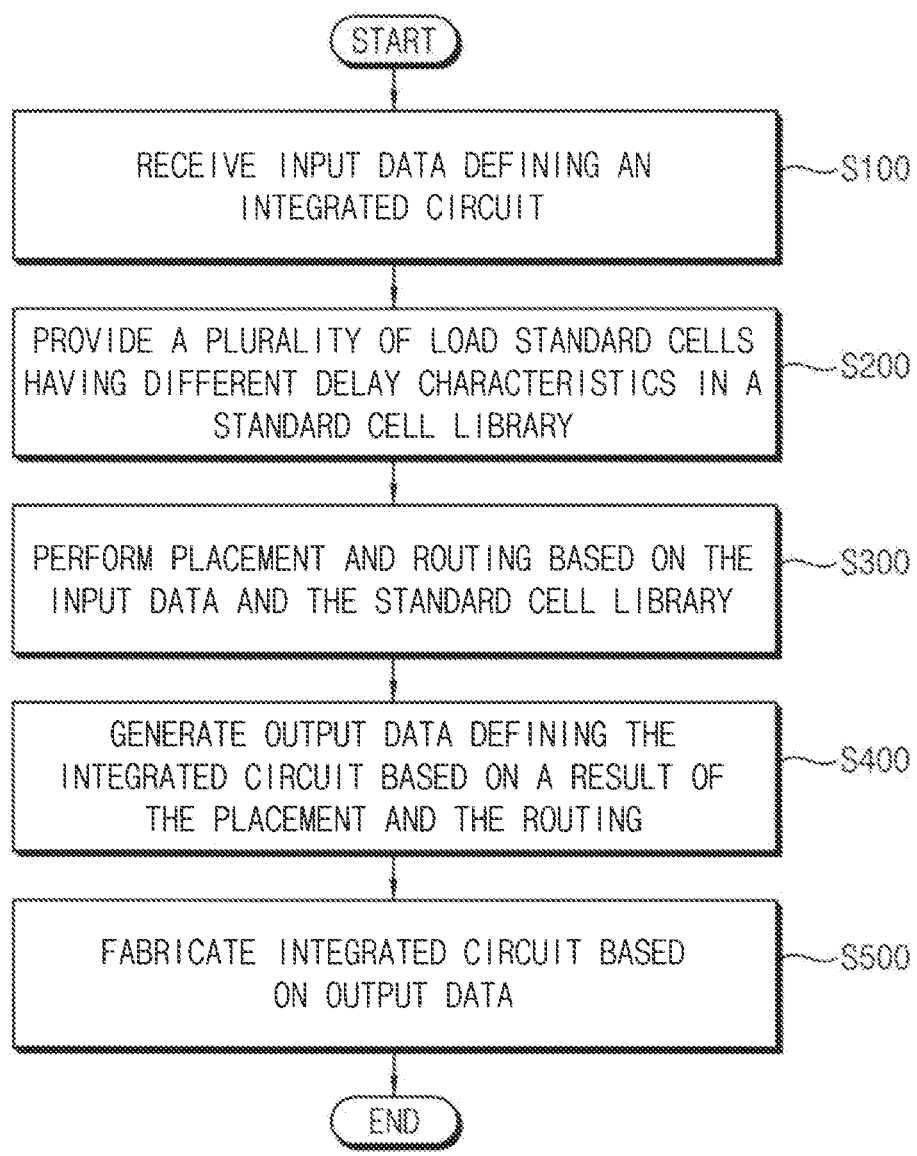
FIG. 1 is a diagram illustrating a method of designing and fabricating an integrated circuit according to some example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a diagram illustrating a method of designing and fabricating an integrated circuit according to some example embodiments.

The method of FIG. 1 may include a method of designing a layout of the integrated circuit that is performed by a designing tool. In some example embodiments, the designing tool may include a programming software including a plurality of instructions executable by a processor, that is, software implemented in some form of hardware (e.g. processor, ASIC, etc.)

Referring to FIG. 1, input data defining the integrated circuit may be received (S100). For example, an integrated circuit may be defined by a plurality of cells and the integrated circuit may be designed using a cell library including information of the plurality of cells. Hereinafter, a cell may be a standard cell and a cell library may be a standard cell library.

In some example embodiments, the input data may be data generated from an abstract form with respect to behavior of the integrated circuit. For example, the input data may be defined in a register transfer level (RTL) through synthesis using the standard cell library. For example, the input data may be a bitstream and/or a netlist that is generated by synthesizing the integrated circuit defined by a hardware description language (HDL) such as VHSIC hardware description language (VHDL) or Verilog.

In some example embodiments, the input data may be data for defining the layout of the integrated circuit. For example, the input data may include geometric information for defining a structure implemented as a semiconductor material, a metal, and an insulator. A layout of the integrated circuit indicated by the input data may have a layout of the cells and conducting wires used to connect a cell to other cells, for example.

A plurality of load standard cells having different delay characteristics are provided in a standard cell library (S200). The plurality of load standard cells may be a portion of standard cells included in the standard cell library.

The term "standard cell" may refer to a unit of an integrated circuit in which a size of the layout meets a preset or specified rule. The standard cell may include an input pin and an output pin and may process a signal received through the input pin to output a signal through the output pin. For example, the standard cell may be a basic cell such as an AND logic gate, an OR logic gate, a NOR logic gate, or an inverter, a complex cell such as an OR/AND/INVERTER (OAI) or an AND/OR/INVERTER (AOI), and a storage element such as a master-slave flip flop or a latch. The term "load standard cell" may refer to a unit of an integrated circuit that includes or consists of a capacitor or a plurality of capacitors, each capacitor having a first node connected to, e.g., directly connected to, a standard cell, and having a second node connected to, e.g. directly connected to, a power supply.

The load standard cell may include only one input-output pin corresponding to a load node. According to some example embodiments, a plurality of capacitors having different capacitance values may be provided as the plurality of load standard cells having the different delay characteristics. Some example embodiments of the load standard cell will be described below with reference to FIGS. 12A through 16B.

The standard cell library may include information about a plurality of standard cells. For example, the standard cell library may include a name and a function of a standard cell, as well as timing information, power information, and layout information of the standard cell. The standard cell library may be stored in a storage device and the standard cell library may be provided by accessing the storage device.

Placement and routing are performed based on the input data and the standard cell library (S300) and output data defining the integrated circuit are provided based on a result of the placement and the routing (S400). The integrated circuit may be manufactured, e.g. fabricated, using one or more photomasks generated from the output data (S500).

In some example embodiments, when the received input data are data such as the bitstream or the netlist generated by synthesizing the integrated circuit, the output data may be the bitstream or the netlist. In other example embodiments, when the received input data are data defining the layout of the integrated circuit, for example, the data having a graphic data system II (GDSII) format, a format of the output data may also be data defining the layout of the integrated circuit.

As such, the method of designing the integrated circuit and the integrated circuit by the method according to some example embodiments may enhance design efficiency and performance of the integrated circuit by designing the integrated circuit with delay matching and duty ratio adjustment using the load standard cell.

Figure 2:
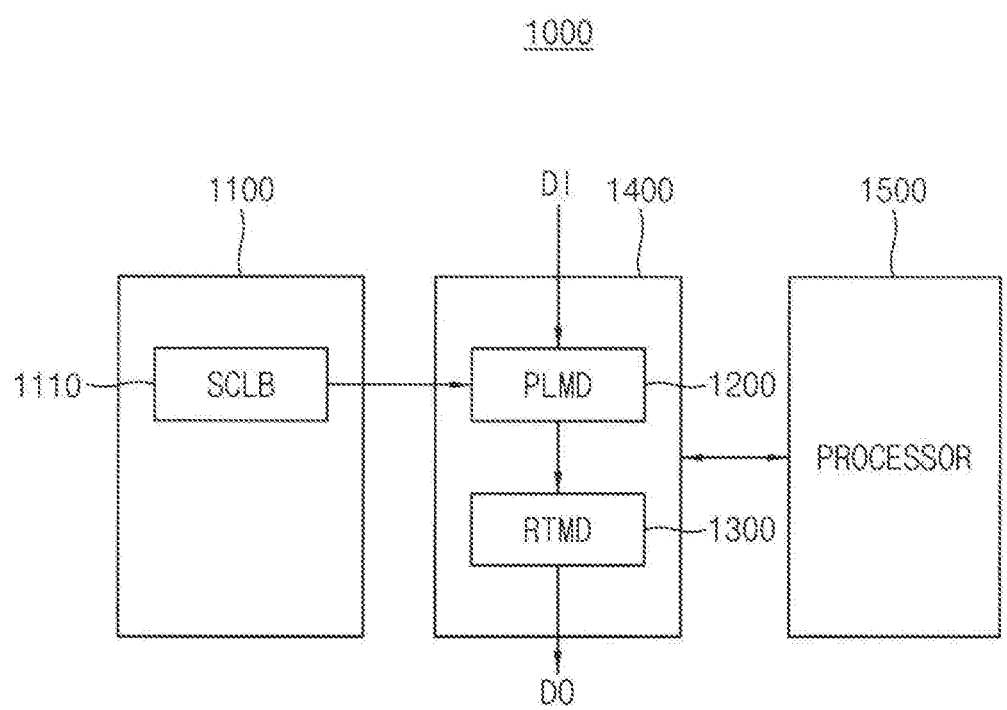
FIG. 2 is a block diagram illustrating a designing system of an integrated circuit according to some example embodiments.

FIG. 2 is a block diagram illustrating a designing system of an integrated circuit according to some example embodiments.

Referring to FIG. 2, a designing system 1000 may include a storage medium 1100, a designing module 1400 and a processor 1500.

The storage medium 1100 (e.g., a storage device) may store a standard cell library SCLB 1110. The standard cell library 1110 may be provided from the storage medium 1100 to the designing module 1400. The standard cell library 1110 may include a plurality of standard cells. The plurality of standard cells may include a plurality of load standard cells having different delay characteristics. The standard cell may be a small, e.g., minimum, unit for designing a block, a device and/or a chip.

The storage medium 1100 may include any computer-readable storage medium used to provide commands and/or data to a computer as a computer-readable storage medium. For example, the computer-readable storage medium 1100 may include volatile memory such as random access memory (RAM), read only memory (ROM), etc. and non-volatile memory such as flash memory, magnetoresistive RAM (MRAM), phase-change RAM (PRAM), resistive RAM (RRAM), etc. The computer-readable storage medium 1100 may be inserted into the computer, may be integrated in the computer, or may be coupled to the computer through a communication medium such as a network and/or a wireless link.

The designing module 1400 may include a placement module PLMD 1200 and a routing module RTMD 1300.

Herein, the term "module" may indicate, but is not limited to, a software and/or hardware component, such as a field programmable gate array (FPGA) or an application specific integrated circuit (ASIC), which performs certain tasks. A module may be configured to reside in a tangible, addressable storage medium and be configured to execute on one or more processors. For example, a module may include software components, class components, task components, processes, functions, attributes, procedures, subroutines, program code segments, drivers, firmware, micro codes, circuits, data, database, data structures, tables, arrays, parameters, etc. A module may be divided into a plurality of modules performing detailed functions.

The placement module 1200 may, using the processor 1500, arrange standard cells based on input data DI defining the integrated circuit as well as the standard cell library 1110. The routing module 1300 may perform signal routing with respect to cell placement provided from the placement module 1200. If the routing is not successful, the placement module 1200 may modify the previous cell placement and the routing module 1300 may perform the signal routing with the modified cell placement. When the routing is successfully completed, the routing module 1300 may provide output data D0 defining the integrated circuit.

The placement module 1200 and the routing module 1300 may be implemented by a single integrated designing module 1400 or may be implemented by separate and different modules. The integrated designing module 1400 including the placement module 1200 and the routing module 1300 may perform the placement and the routing such that the delay matching and/or the duty ratio adjustment may be implemented in the integrated circuit using the plurality of load standard cells.

The placement module 1200 and/or the routing module 1300 may be implemented in software, but inventive concepts are not limited thereto. If the placement module 1200 and the routing module 1300 are implemented in software, they may be stored in the storage medium 1100 as program codes or in other storage mediums.

The processor 1500 may be used when the designing module 1400 performs a computation. In FIG. 2, only one processor 1500 is illustrated, but inventive concepts are not limited thereto. For example, a plurality of processors may be included in the designing system 1000. In addition, the processor 1500 may include cache memories, which increase computation capacity.

The designing module 1400 may determine a delay difference between a first signal path and a second signal path of the integrated circuit where delay matching is required or specified between the first signal path and the second signal path. The placement module 1200 may place a selected load standard cell among the plurality of load standard cells where the selected load standard cell is to provide a delay corresponding to the delay difference through a load node. The routing module 1300 may route the selected load standard cell such that the load node of the selected load standard cell is connected to one of the first signal path and the second signal path that has a smaller delay.

As such, the integrated circuit and the method of designing the integrated circuit according to some example embodiments may enhance design efficiency and performance of the integrated circuit by designing the integrated circuit with delay matching and duty ratio adjustment using the load standard cell.

Figure 3:
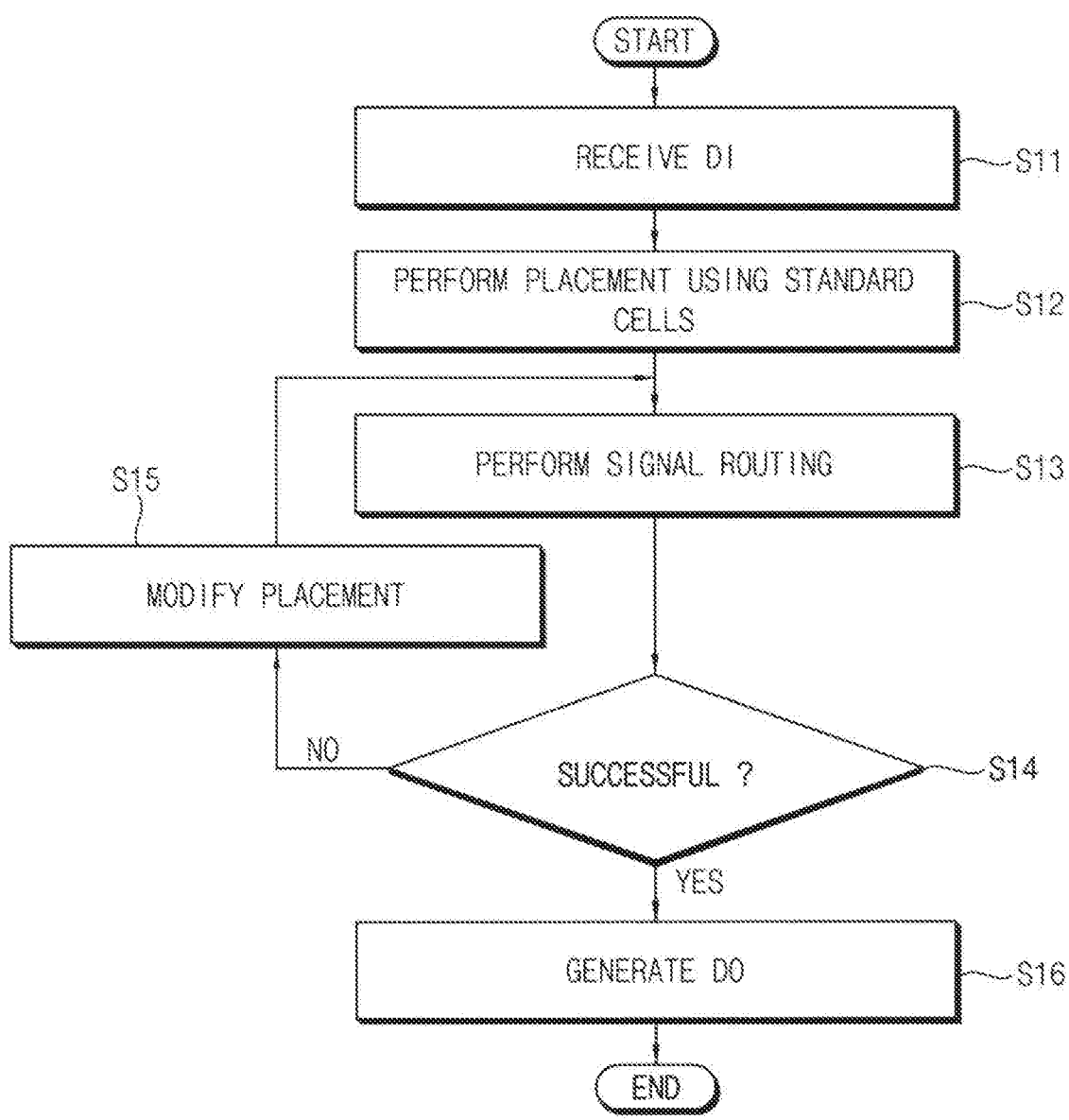
FIG. 3 is a flow chart illustrating an example operation of the designing system of FIG. 2.

FIG. 3 is a flow chart illustrating an example operation of the designing system of FIG. 2.

Referring to FIGS. 2 and 3, the designing module 1400 may receive the input data DI defining the integrated circuit (S11). The placement module 1200 may refer to the standard cell library 1110 so as to extract standard cells corresponding to the input data DI, and may perform cell placement using the extracted standard cells (S12). The routing module 1300 may perform signal routing with respect to the placed cells (S13). When the signal routing is not successful (S14: NO), the placement module 1200 may replace at least one standard cell, e.g. may replace at least one standard cell with another standard cell, to modify the placement of the cells. The routing module 1300 may perform the signal routing again with respect to the modified placement (S13).

As such, the replacement and the routing may be repeated until the signal routing is successfully completed. The success of the placement and the routing may include the success of delay matching and/or duty ratio adjustment. When the signal routing is successfully completed (S14: YES), the designing module 1400 may generate the output data D0 defining the integrated circuit (S16).

Hereinafter, structures of a cell and an integrated circuit including a plurality of cells are described using a first direction X, a second direction Y and a third direction Z in a three-dimensional space. The first direction X may be a row direction, the second direction Y may be a column direction and the third direction Z may be a vertical direction.

Figure 4:
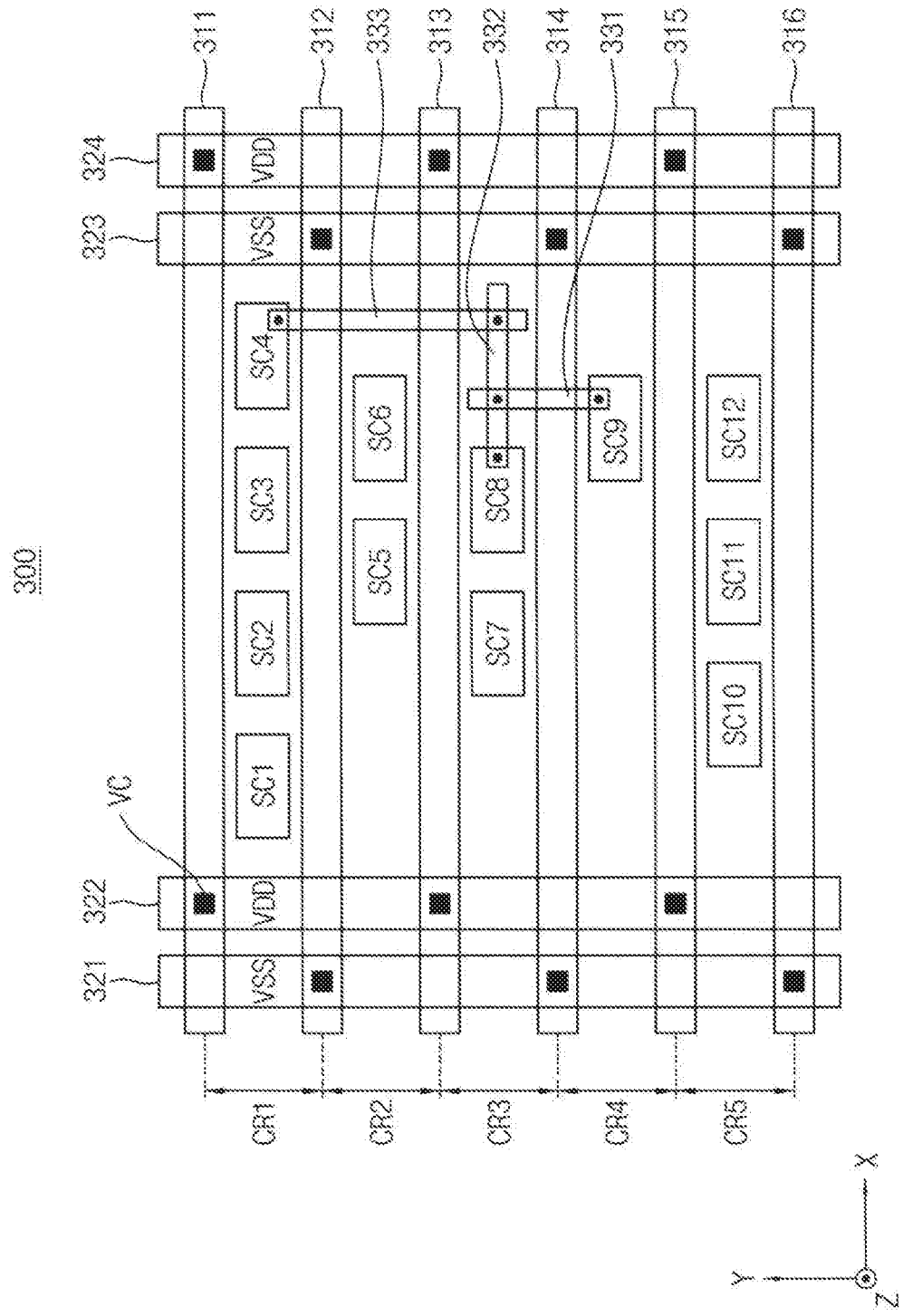
FIG. 4 is a diagram illustrating a layout of an integrated circuit according to some example embodiments.

FIG. 4 is a diagram illustrating a layout of an integrated circuit according to some example embodiments.

An integrated circuit 300 of FIG. 4 may be an application specific integrated circuit (ASIC). A layout of the integrated circuit 300 may be determined by performing the above-described placement and routing of standard cells SC1~SC12. Power may be provided to the standard cells SC1~SC12 through power rails 311~316. The power rails 311~316 may include high power rails 311, 313, and 315 configured to provide a first power supply voltage VDD and low power rails 312, 314, and 316 configured to provide a second power supply voltage VSS that is lower than the first power supply voltage VDD. For example, the first power supply voltage VDD may have a positive voltage level and the second power supply voltage VSS may have a ground level (e.g., 0V) or a negative voltage level.

The high power rails 311, 313, and 315 and the low power rails 312, 314, and 316 extend in the row direction X and be arranged alternatively one by one in the column direction Y to form boundaries of a plurality of circuit rows CR1~CR5 that is arranged in the column direction Y. The numbers of the power rails and the circuit rows are non-limiting examples and may be determined variously.

According to some example embodiments, power may be distributed to the power rails 311~316 through power mesh routes 321~324 that extend in the column direction Y. Some power mesh routes 322 and 324 may provide the first power supply voltage VDD and other power mesh routes 321 and 323 may provide the second power supply voltage VSS. The power mesh routes 321~324 may be connected to the power rails 311~316 through vertical contacts VC such as via contacts.

In general, each of the circuit rows CR1~CR5 may be connected to two adjacent power rails that are at boundaries thereof so as to be powered. For example, the standard cells SC1, SC2, SC3, and SC4 in the first circuit row CR1 may be connected to an adjacent and corresponding power rail pair including the high power rail 311 and the low power rail 312.

For example, as illustrated in FIG. 4, an output node of the eighth standard cell SC8 and an input node of the ninth standard cell SC9 may be connected through wirings 331 and 332. The eighth and ninth standard cells SC8 and SC9 may be logic standard cells performing each logic operation, and the output node of the eighth standard cell SC8 or the input node of the ninth standard cell SC9 may be a delay node that requires a certain delay. In this case, the fourth standard cell SC4 corresponding to the above-described load standard cell may be connected to the delay node through a wiring 333.

Figure 5:
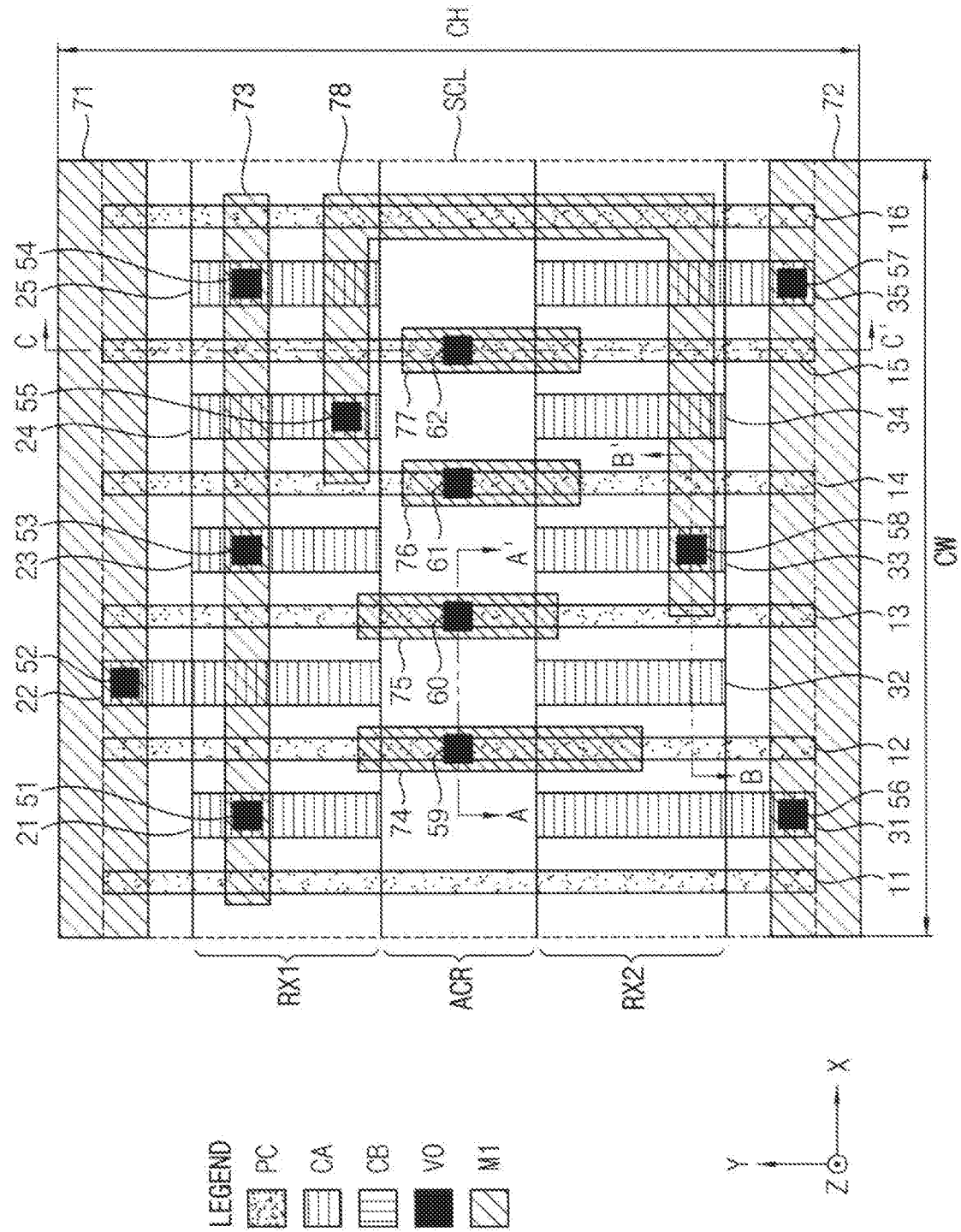
FIG. 5 is a diagram illustrating a layout of an example standard cell.
Figure 6A:
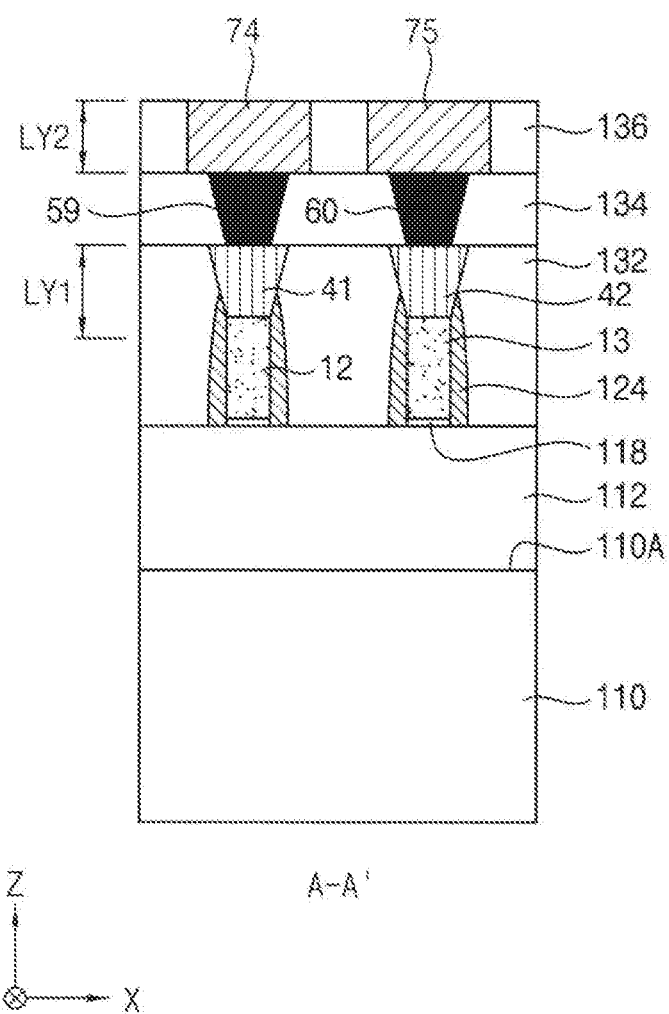
FIGS. 6A, 6B and 6C are cross-sectional views of a standard cell that may have the same layout as the standard cell of FIG. 5.
Figure 6B:
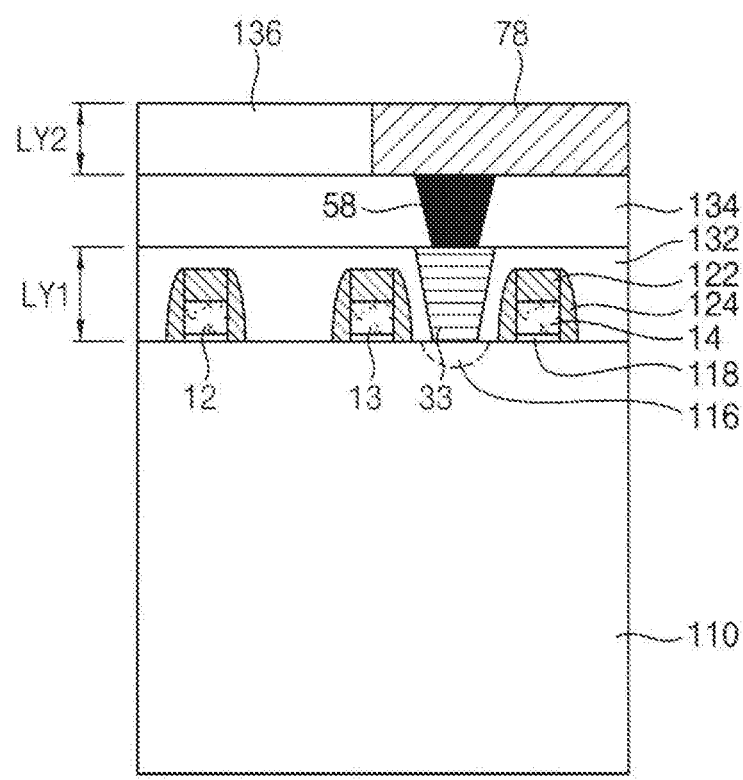
Figure 6C:
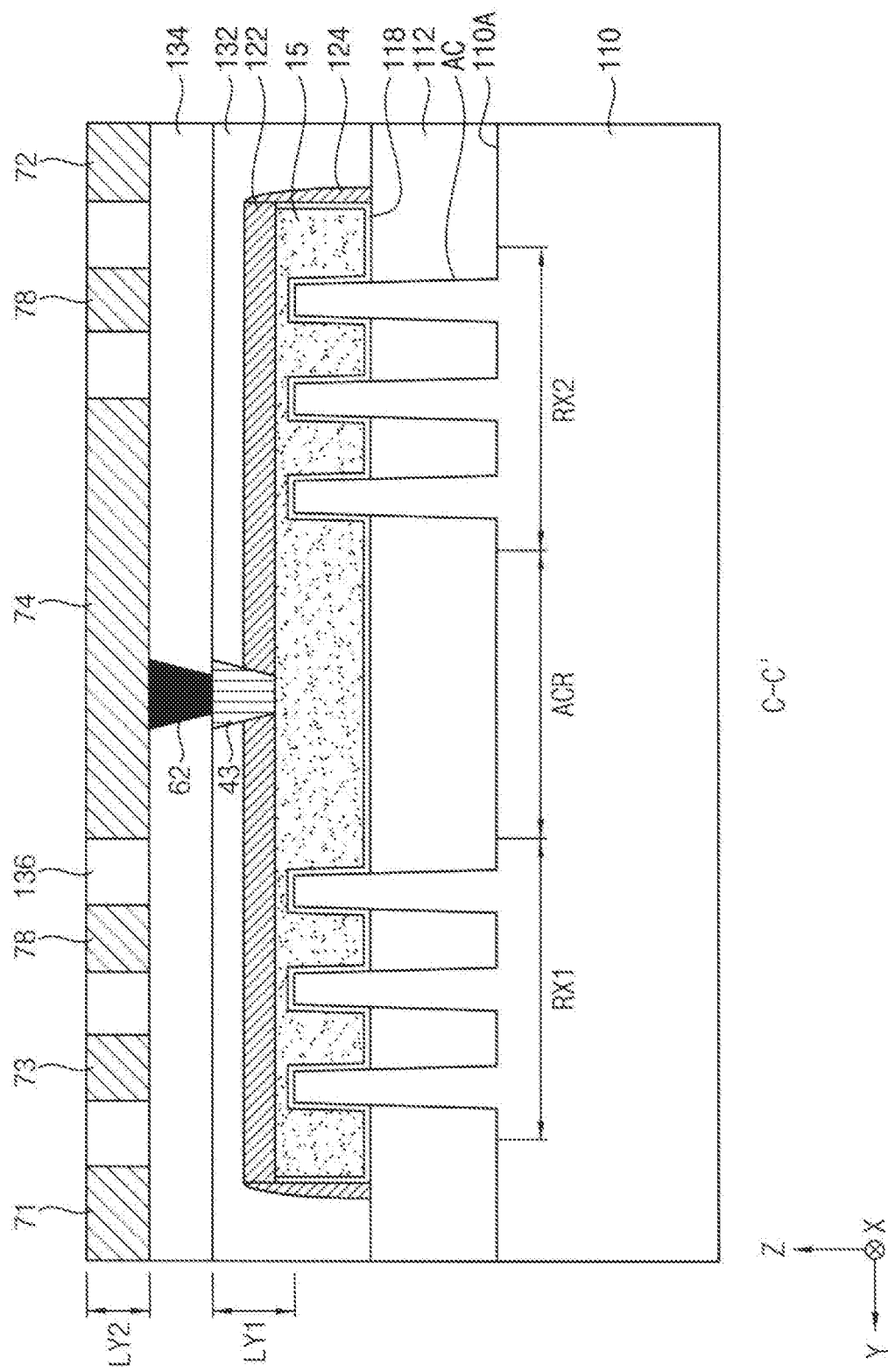

FIG. 5 is a diagram illustrating a layout of an example standard cell, and FIGS. 6A, 6B and 6C are cross-sectional views of a standard cell that may have the same layout as the standard cell of FIG. 5.

FIGS. 6A, 6B, and 6C illustrate a portion of a standard cell SCL that includes a fin field effect transistor (FinFET). FIG. 6A is a cross-sectional view of the standard cell SCL of FIG. 5 cut along a line A-A'. FIG. 6B is a cross-sectional view of the standard cell SCL of FIG. 5 cut along a line B-B'. FIG. 6C is a cross-sectional view of the standard cell SCL of FIG. 5 cut along a line C-C'.

Referring to FIGS. 5, 6A, 6B and 6C, the standard cell SCL may be formed on a substrate 110 having an upper surface 110A that extends in a horizontal direction, e.g., the first direction X and the second direction Y.

In some example embodiments, the substrate 110 may include a semiconductor such as Si or Ge or a compound semiconductor such as SiGe, SiC, GaAs, InAs, or InP. In some example embodiments, the substrate 110 may have a silicon on insulator (SOI) structure. The substrate 110 may include a conductive area such as an impurity-doped well or an impurity-doped structure.

The standard cell SCL includes a first device area RX1, a second device area RX2 and an active cut area ACR separating the first and second device areas RX1 and RX2. In each of the first and second device areas RX1 and RX2, a plurality of fin-type active areas AC protruding from the substrate 110 may be formed.

The plurality of active areas AC may extend in parallel to one another in the first direction X. A device isolation layer 112 may be formed between the plurality of active areas AC on the substrate 110. The plurality of active areas AC protrude from the device isolation layer 112 in the form of fins.

A plurality of gate insulation layers 118 and a plurality of gate lines PC 11, 12, 13, 14, 15 and 16 may be formed on the substrate 110. The gate lines PC 11, 12, 13, 14, 15 and 16 may extend in the second direction Y crossing the plurality of active areas AC. The plurality of gate insulation layers 118 and the plurality of gate lines PC 11, 12, 13, 14, 15 and 16 may extend while covering an upper surface and two sidewalls of each of the active areas AC and an upper surface of the device isolation layer 112. A plurality of metal oxide semiconductor (MOS) transistors may be formed along the plurality of gate lines PC 11, 12, 13, 14, 15 and 16. The MOS transistors may have a three-dimensional structure in which channels are formed in the upper surface and the two sidewalls of the active areas AC.

The gate insulation layers 118 may be formed of a silicon oxide layer, a high-k dielectric layer, or a combination thereof. The plurality of gate lines PC 11, 12, 13, 14, 15 and 16 may extend on the gate insulation layers 118 across the plurality of active areas AC while covering the upper surface and the two sidewalls of each of the active areas AC.

A mask 122 may be formed on each of the gate lines PC 11, 12, 13, 14, 15, and 16. Side walls of the insulation layer 118, the gate line PC and the mask 122 may be covered by a spacer 124. The gate lines PC 11, 12, 13, 14, 15 and 16 may have a structure in which a metal nitride layer, a metal layer, a conductive capping layer, and a gap-fill metal layer are sequentially stacked. The metal nitride layer and the metal layer may include Ti, Ta, W, Ru, Nb, Mo, and/or Hf. The metal layer and the metal nitride layer may be formed, for example, by using an atomic layer deposition (ALD) method, a metal organic ALD method, and/or a metal organic chemical vapor deposition (MOCVD) method. The conductive capping layer may function as a protection layer that prevents oxidization of a surface of the metal layer. In addition, the conductive capping layer may function as an adhesive layer (e.g., a wetting layer) that facilitates deposition of another conductive layer on the metal layer. The conductive capping layer may be formed of a metal nitride such as a TiN or TaN or a combination thereof, but inventive concepts are not limited thereto. The gap-fill metal layer may fill spaces between the active areas AC and extend on the conductive capping layer. The gap-fill metal layer may be formed of a W (e.g., tungsten) layer. The gap-fill metal layer may be formed, for example, by using an ALD method, a CVD method, or a physical vapor deposition (PVD) method.

A plurality of conductive contacts CA and CB are formed at a first layer LY1 on the active areas AC. The plurality of conductive contacts CA and CB include a plurality of first contacts CA 21, 22, 23, 24, 25, 31, 32, 33, 34 and 35 connected to a source/drain area 116 of the active areas AC and a plurality of second contacts CB 41, 42 and 43 connected to the gate lines 11, 12, 13, 14, 15 and 16.

The plurality of conductive contacts CA and CB may be insulated from each other by a first interlayer insulation layer 132 that covers the active areas AC and the gate lines GL. The plurality of conductive contacts CA and CB may have an upper surface that is at substantially the same level as an upper surface of the first interlayer insulation layer 132. The first interlayer insulation layer 132 may be formed of a silicon oxide layer, but inventive concepts are not limited thereto.

A second interlayer insulation layer 134 and a plurality of lower via contacts V0 51, 52, 53, 54, 55, 56, 57, 58, 59, 60, 61 and 62 that pass through the second interlayer insulation layer 134 are formed on the first interlayer insulation layer 132. The second interlayer insulation layer 134 may be formed of a silicon oxide layer, but inventive concepts are not limited thereto.

A plurality of wirings M1 71, 72, 73, 74, 75, 76, 77 and 78 extending in the horizontal direction at a second layer LY2, which is higher than the first layer LY1, are formed on the second interlayer insulation layer 134.

Each of the wirings M1 may be connected to one of the plurality of conductive contacts CA and CB through one of the plurality of lower via contacts V0 formed between the first layer LY1 and the second layer LY2. Each of the plurality of lower via contacts V0 may be connected to one of the plurality of conductive contacts CA and CB, for example, by passing through the second interlayer insulation layer 134. The plurality of lower via contacts V0 may be insulated from one another by the second interlayer insulation layer 134.

The wirings 71~78 may include an internal connection wiring that electrically connects a plurality of areas in the standard cell SCL. For example, the internal connection wiring 78 may electrically connect the active area AC in the first device area RX1 and the active area AC in the second device area RX2 through the lower via contacts 55 and 58 and the first contacts 24 and 33.

Wirings 71 and 72 may correspond to a first power rail and second power rail, respectively. The first power rail 71 may be connected to the active area AC which is in the first device area RX1, and the second power rail 72 may be connected to the active area AC which is in the second device area RX2. One of the first and second power rails 71 and 72 may be a wiring for supplying a power supply voltage (e.g., the first power supply voltage VDD) and the other of the first and second power rails 71 and 72 may be a wiring for supplying a ground voltage (e.g., the second power supply voltage VSS).

The first power rail 71 and the second power rail 72 may extend in the first direction X in parallel to one another on the second layer LY2. In some example embodiments, the power rails 71 and 72 may be formed at substantially the same time with the other wirings 73~78. The wirings M1 may be formed to pass through a third interlayer insulation layer 136. The third interlayer insulation layer 136 may insulate the wirings M1 from one another.

A height CH of the standard cell SCL may be defined by the distance along the second direction Y between the first power rail 71 and the second power rail 72. In addition, a width CW of the standard cell SCL may be defined along the first direction X that is parallel to the power rails 71 and 72.

The wirings M1 may have to meet limitations due to a minimum spacing rule. For example, the wirings M1 may have to meet limitations according to a "tip-to-side" restriction and a "corner rounding" restriction. The size and disposition of the wirings M1 may be limited by such restrictions.

The lower via contacts V0 and the wirings M1 may have a stacked structure of a barrier layer and a wiring conductive layer. The barrier layer may be formed, for example, of TiN, TaN, or a combination thereof. The wiring conductive layer may be formed, for example, of W, Cu, an alloy thereof, or a combination thereof. A CVD method, an ALD method, and/or an electroplating method may be used to form the wirings M1 and the lower via contacts V0.

The integrated circuit according to some example embodiments may correspond to a single standard cell that is formed as described above or a combination of various standard cells.

Figure 7:
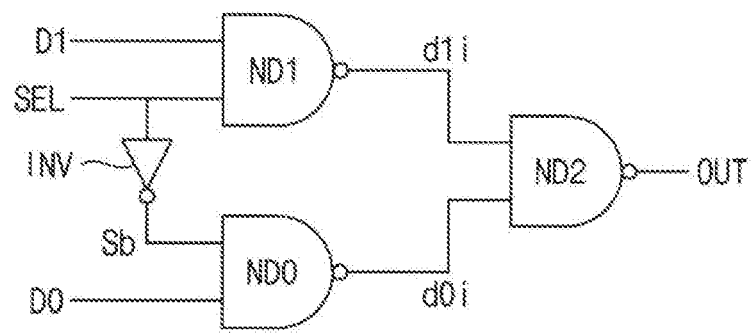
FIG. 7 is a diagram illustrating an example integrated circuit.
Figure 8:
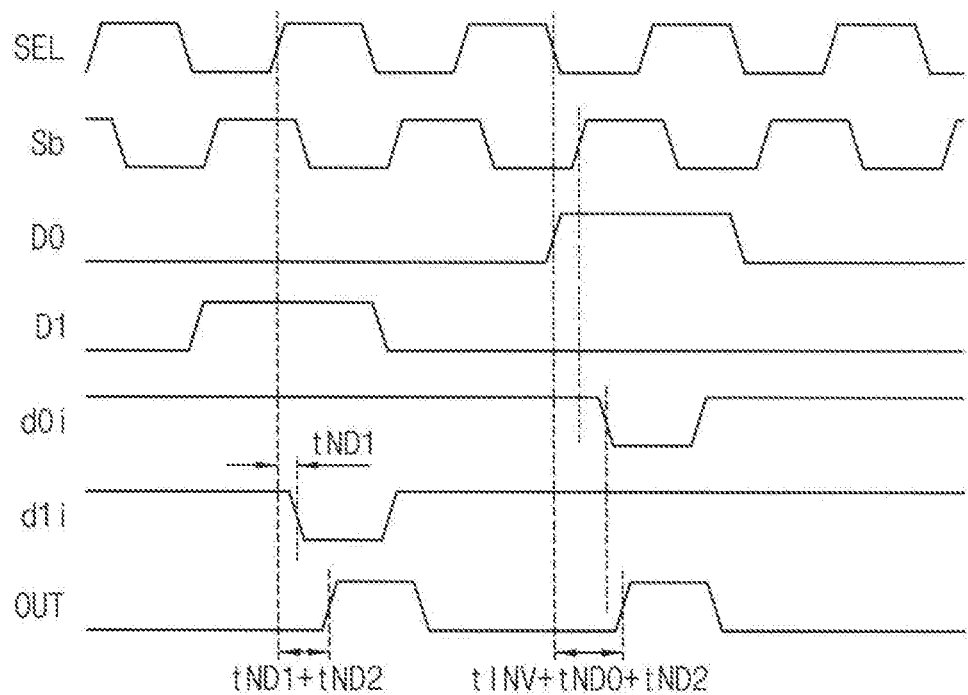
FIG. 8 is a timing diagram illustrating an operation of the integrated circuit of FIG. 7.

FIG. 7 is a diagram illustrating an example integrated circuit, and FIG. 8 is a timing diagram illustrating an operation of the integrated circuit of FIG. 7.

Referring to FIG. 7, an integrated circuit 401 may include a first NAND gate ND0, a second NAND gate ND1 and a third NAND gate ND2. The integrated circuit of FIG. 7 corresponds to a configuration to generate a double data rate (DDR) signal.

The first NAND gate ND0 performs a NAND operation on a first data signal D0 and an inversion signal Sb of a selection signal SEL to generate a first internal signal d0$i$. The selection signal SEL may be a clock signal as illustrated in FIG. 8. The second NAND gate ND1 performs a NAND operation on a second data signal D1 and the selection signal SEL to generate a second internal signal d1$i$. The third NAND gate ND2 performs a NAND operation on the first internal signal d0$i$ and the second internal signal d1$i$ to generate an output signal OUT.

Referring to FIGS. 7 and 8, the integrated circuit 401 samples the second data signal D1 in synchronization with rising edges of the selection signal SEL and samples the first data signal D0 in synchronization with falling edges of the selection signal SEL. The sampled data of the second data signal D1 included in the output signal OUT has a delay of tND1+tND2, and the sampled data of the first data signal D0 included in the output signal OUT has a delay of tINV+tND0+tND2. Here tINV indicates a delay of the inverter INV, tND0 indicates a delay of the first NAND gate ND0, tND1 indicates a delay of the second NAND gate ND1, and tND2 indicates a delay of the third NAND gate ND2.

A delay difference may be caused between the first internal signal d0$i$ and the second internal signal d1$i$ due to a delay of the inversion signal Sb with respect to the selection signal SEL. The delay difference is reflected to the output signal OUT and thus the output signal OUT has propagation delay deviation. For example, the propagation delay deviation is caused between a case of logic low "0" of the selection signal SEL and a case of logic high "1" of the selection signal SEL due the delay of the inverter INV. In this case, as will be described below with reference to FIG. 11, degeneration occurs in an eye pattern of the output signal OUT and a valid window margin may be decreased.

Figure 9:
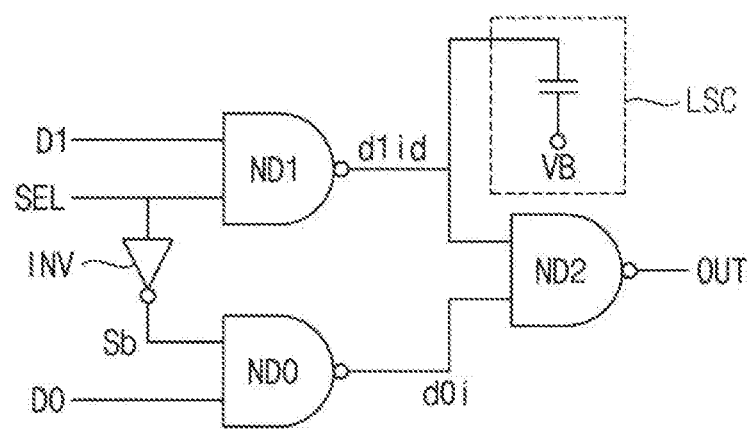
FIG. 9 is a diagram illustrating an integrated circuit according to some example embodiments.
Figure 10:
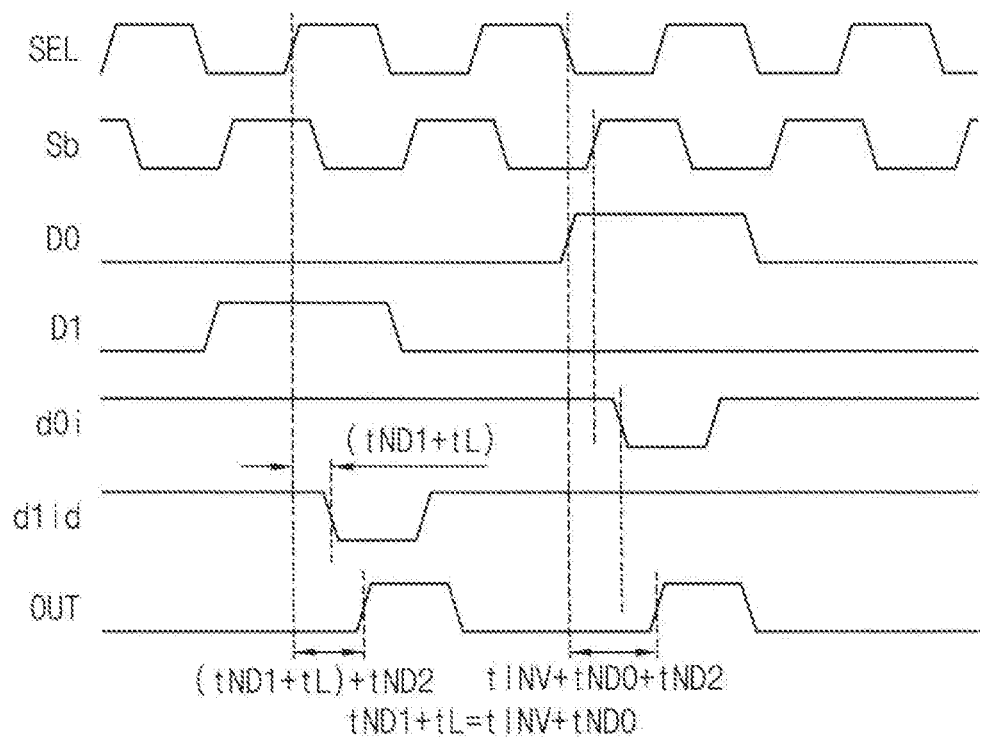
FIG. 10 is a timing diagram illustrating an operation of the integrated circuit of FIG. 9.

FIG. 9 is a diagram illustrating an integrated circuit according to some example embodiments, and FIG. 10 is a timing diagram illustrating an operation of the integrated circuit of FIG. 9.

Referring to FIG. 9, an integrated circuit 402 may include a first NAND gate ND0, a second NAND gate ND1, a third NAND gate ND2, and a load standard cell LSC. The integrated circuit of FIG. 9 corresponds to a configuration of FIG. 7 to generate a signal, e.g. a DDR signal.

The first NAND gate ND0 performs a NAND operation on a first data signal D0 and an inversion signal Sb of a selection signal SEL to generate a first internal signal d0$i$. The selection signal SEL may be a clock signal as illustrated in FIG. 10. The second NAND gate ND1 performs a NAND operation on a second data signal D1 and the selection signal SEL to generate a second internal signal d1$id$. The load standard cell LSC is connected to the output node of the second NAND gate ND1 to provide an additional delay. The load standard cell LSC may include a first electrode connected to the output node of the second NAND gate ND1 and a second electrode connected to a bias voltage VB. The third NAND gate ND2 performs a NAND operation on the first internal signal d0$i$ and the second internal signal d1$id$ to generate an output signal OUT.

Referring to FIGS. 9 and 10, the integrated circuit 402 may sample the second data signal D1 in synchronization with rising edges of the selection signal SEL and may sample the first data signal D0 in synchronization with falling edges of the selection signal SEL. The sampled data of the second data signal D1 included in the output signal OUT has a delay of (tND1+tL)+tND2, and the sampled data of the first data signal D0 included in the output signal OUT has a delay of tINV+tND0+tND2. Here tL indicates a delay of the load standard cell LSC, tINV indicates a delay of the inverter INV, tND0 indicates a delay of the first NAND gate ND0, tND1 indicates a delay of the second NAND gate ND1, and tND2 indicates a delay of the third NAND gate ND2. tND0, tND1 and tND3 may be substantially the same.

Even though a delay difference may be caused between the first internal signal d0$i$ and the second internal signal d1$id$ due to a delay of the inversion signal Sb with respect to the selection signal SEL, the delay difference may be compensated by the delay tL of the load standard cell LSC. According to some example embodiments, the propagation delay may be controlled by connecting the load standard cell LSC to the output node of the second NAND gate ND1. The delay matching may be performed by selecting an optimum load standard cell among the plurality of load standard cells having different delay characteristics such that the delay difference between tND1+tL and tINV+tND0 may be as small as possible. Through such delay matching, a valid window margin of the output signal OUT may be secured.

Figure 11:
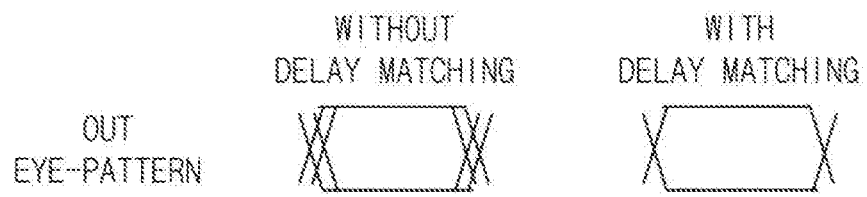
FIG. 11 is a diagram for describing delay matching and duty ratio adjustment in an integrated circuit according to some example embodiments.

FIG. 11 is a diagram for describing delay matching and duty ratio adjustment in an integrated circuit according to some example embodiments.

An eye pattern corresponding to the integrated circuit 401 of FIG. 7 is shown in a left portion of FIG. 11 and an eye pattern corresponding to the integrated circuit 402 of FIG. 9 is shown in a right portion of FIG. 11

As illustrated in FIG. 11, if the eye pattern of the output signal OUT is measured without delay matching, the valid window margin of the eye pattern is reduced due to propagation delay deviation. The valid window margin may be increased if the delay matching is performed to compensate the propagation delay deviation using the load standard cell LSC.

As such, performance of the integrated circuit may be enhanced by performing delay matching using a plurality of load standard cells having different delay characteristics in layout design based on automatic replacement and routing.

FIGS. 12A through 16B are diagrams illustrating a load standard cell according to some example embodiments.

FIGS. 12A through 16B illustrate example embodiments of load standard cells having different delay characteristics. The load standard cells compatible with the FinFET process as described with reference to FIGS. 5 through 6C are illustrated in FIGS. 12B, 13B, 14B, 15B and 16B, but inventive concepts are not limited thereto. As described above, in FIGS. 12B, 13B, 14B, 15B and 16B, PC indicates gate lines, CA indicates first contacts, CB indicates second contacts, V0 indicates via contacts, M1 indicates wirings, CW1 and CW2 indicate cell widths of load standard cells, CH indicates a cell height of the load standard cells, RX1 indicates a first device area, RX2 indicates a second device area and ACR indicates an active cut area. The configurations in FIGS. 12B, 13B, 14B, 15B and 16B may be understood referring to the descriptions of FIGS. 5 through 6C, and thus repeated descriptions may be omitted.

Figure 12A:
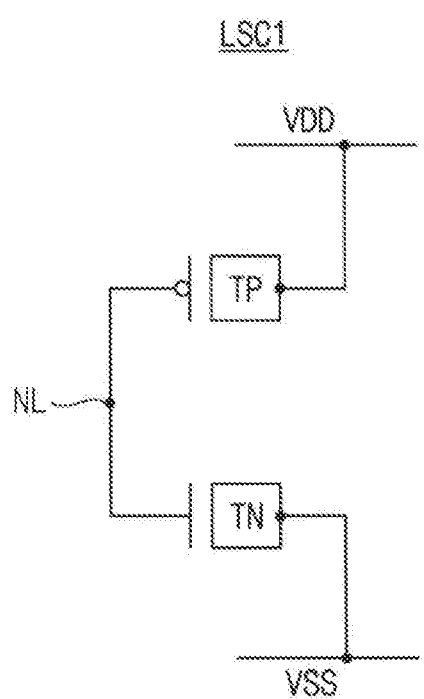
FIGS. 12A through 16B are diagrams illustrating a load standard cell according to some example embodiments.

FIG. 12A illustrates a schematic of a load standard cell LSC1 including a P-channel metal oxide semiconductor (PMOS) transistor TP and an N-channel metal oxide semiconductor (NMOS) transistor TN. Referring to FIG. 12A, a source electrode and a drain electrode of the PMOS transistor TP may be connected to a power supply voltage VDD, a source electrode and a drain electrode of the NMOS transistor TN may be connected to a ground voltage VSS, and a gate electrode of the PMOS transistor TP and a gate electrode of the NMOS transistor TN may be commonly connected to a load node NL for providing a delay. The PMOS transistor TP and the NMOS transistor TN connected as such may be provided as a single load standard cell LSC1 and included in a standard cell library.

Figure 12B:
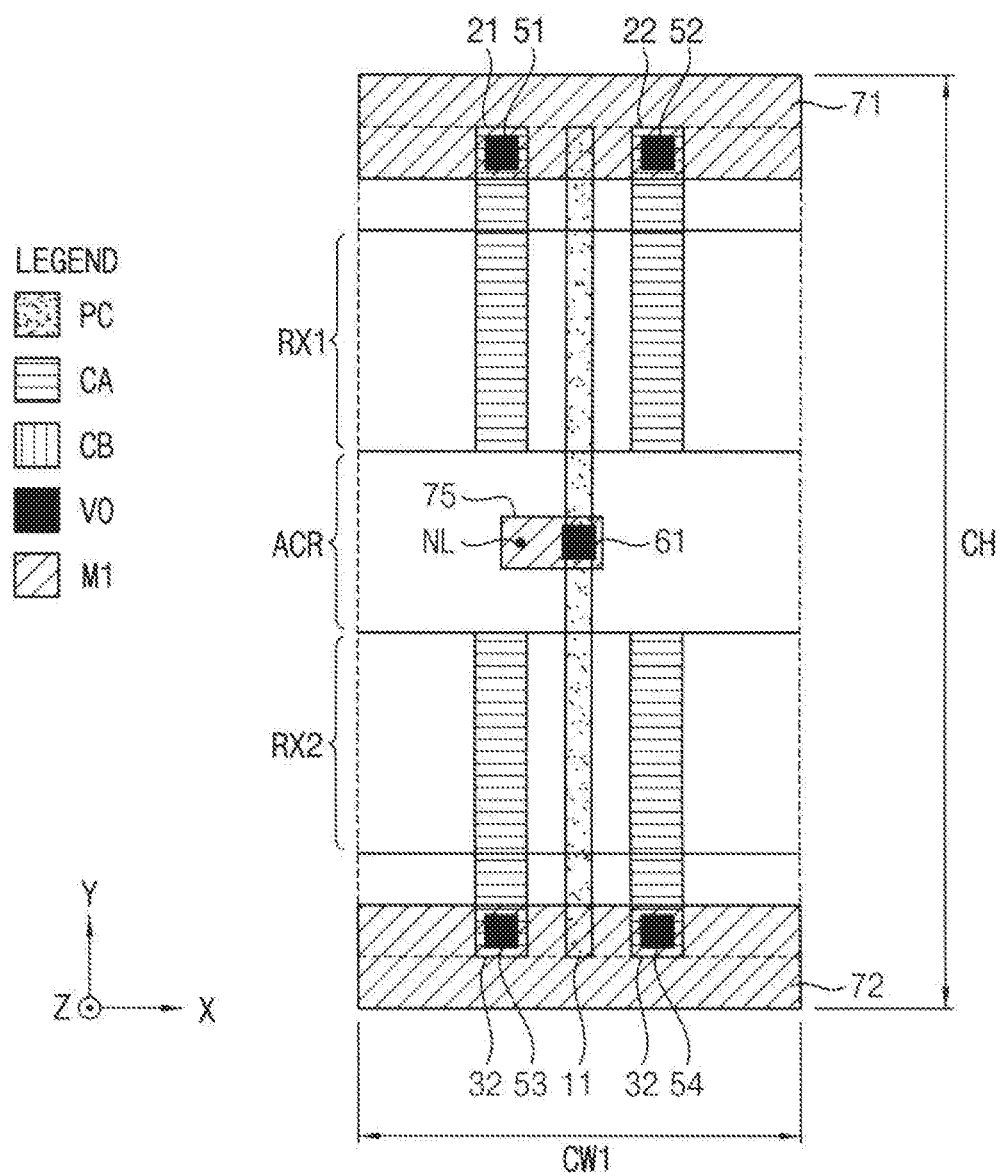

FIG. 12B illustrates an example layout corresponding to the schematic of the load standard cell LSC1 of FIG. 12A. Referring to FIGS. 12A and 12B, the PMOS transistor TP is formed in a first device area RX1 and the NMOS transistor TN is formed in a second device area RX2. In this case, the power supply voltage VDD may be provided through a first power rail 71 and the ground voltage VSS may be provided through a second power rail 72.

The source electrode and the drain electrode of the PMOS transistor TP may be connected to the power supply voltage VDD through first contacts 21 and 22 and via contacts 51 and 52. The source electrode and the drain electrode of the NMOS transistor TN may be connected to the ground voltage VSS through first contacts 31 and 32 and via contacts 53 and 54. The common gate line 11 of the PMOS transistor TP and the NMOS transistor TN may be connected to a wiring 75 through a via contact 61, and the wiring 75 corresponding to a load node NL may be connected to a delay node of another standard cell.

As such, a load standard cell may be implemented using a metal oxide semiconductor (MOS) capacitor that is formed by connecting a source electrode and a drain electrode of a MOS transistor. A plurality of MOS capacitors may be implemented to have different capacitance values so that a plurality of load standard cells including the MOS capacitors may have different delay characteristics.

In some example embodiments, the MOS capacitor may be designed such that, during fabrication of the integrated circuit, the capacitance of the MOS capacitor is controlled by adjusting a density of impurities that are implanted into a gate electrode of the MOS transistor, that is, the gate line 11 in FIG. 12B.

In some example embodiments, the capacitance of the MOS capacitor may be controlled by adjusting a size of the MOS capacitor or the MOS transistor. The size of the MOS capacitor may include a size or a relative position of two opposing conductors of the MOS capacitor, etc. For example, the capacitance value of the MOS capacitor may be controlled by adjusting a length of the gate line 11.

Figure 13A:
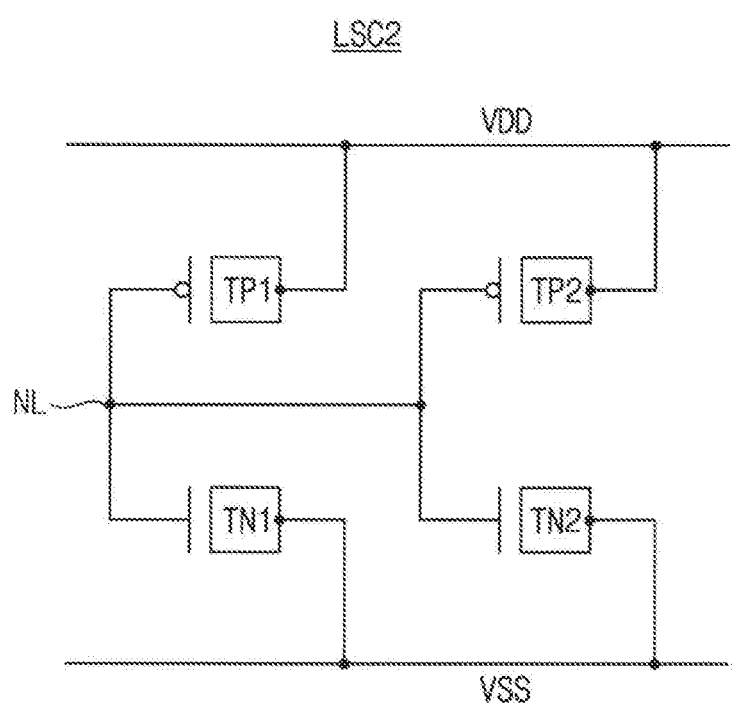
Figure 13B:
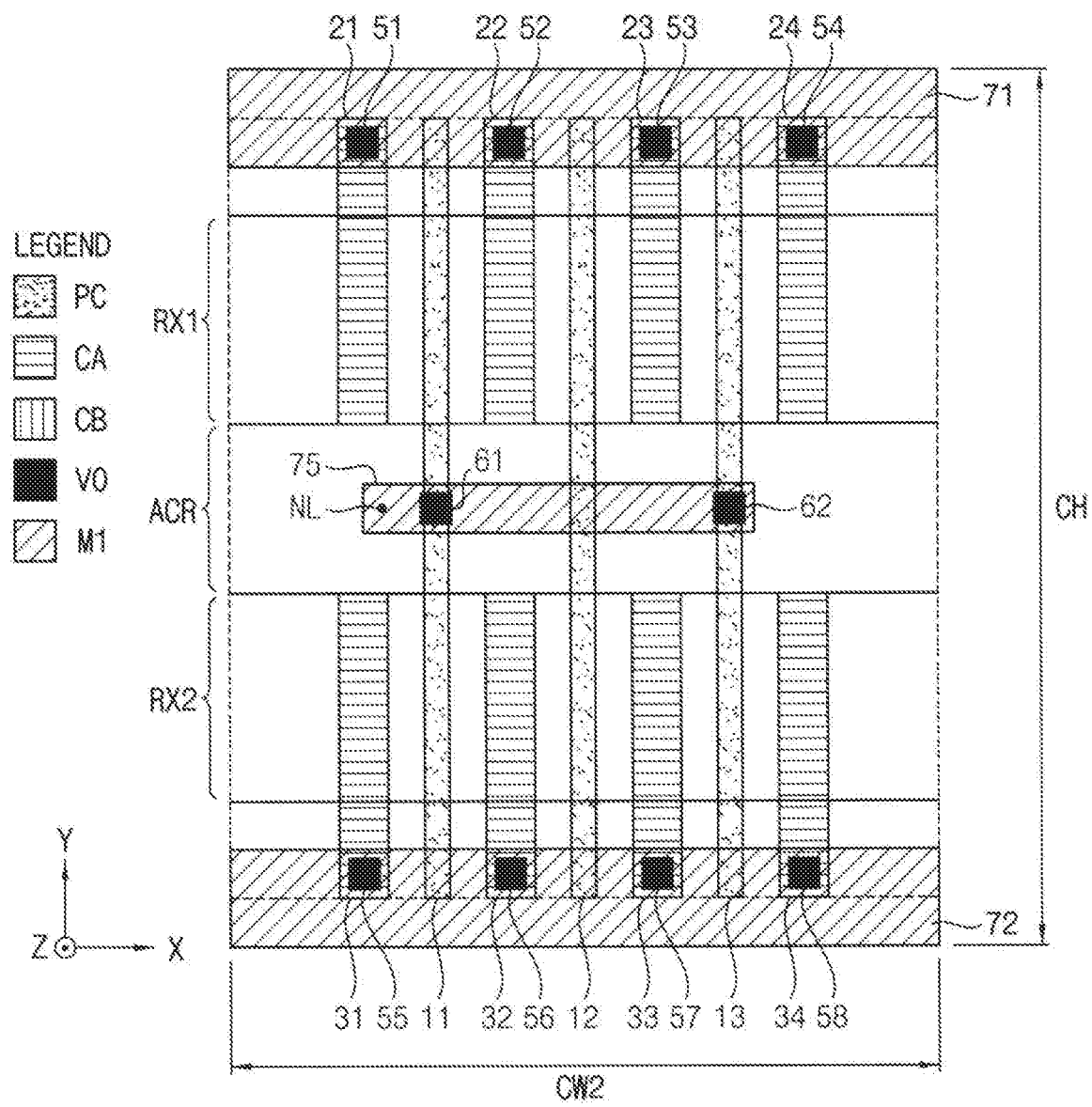
Figure 14A:
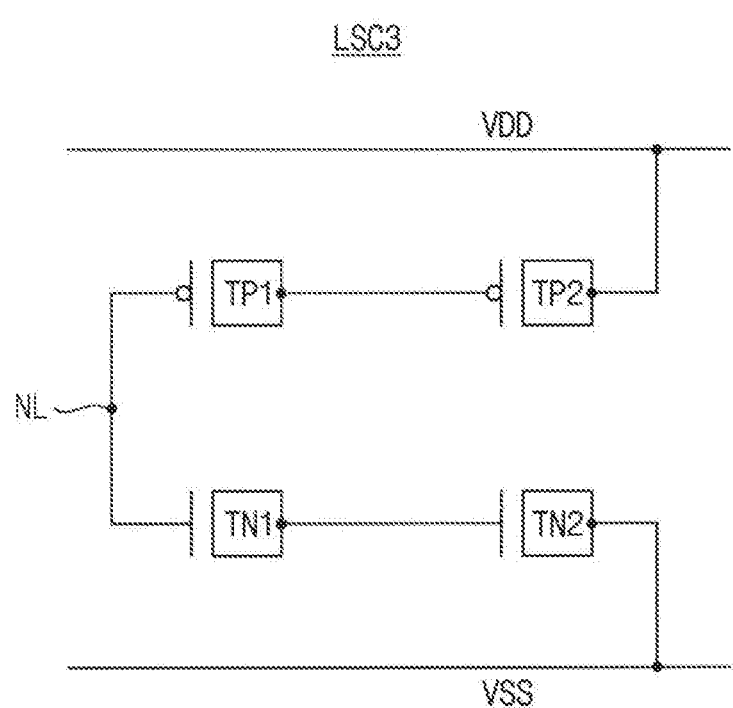
Figure 14B:
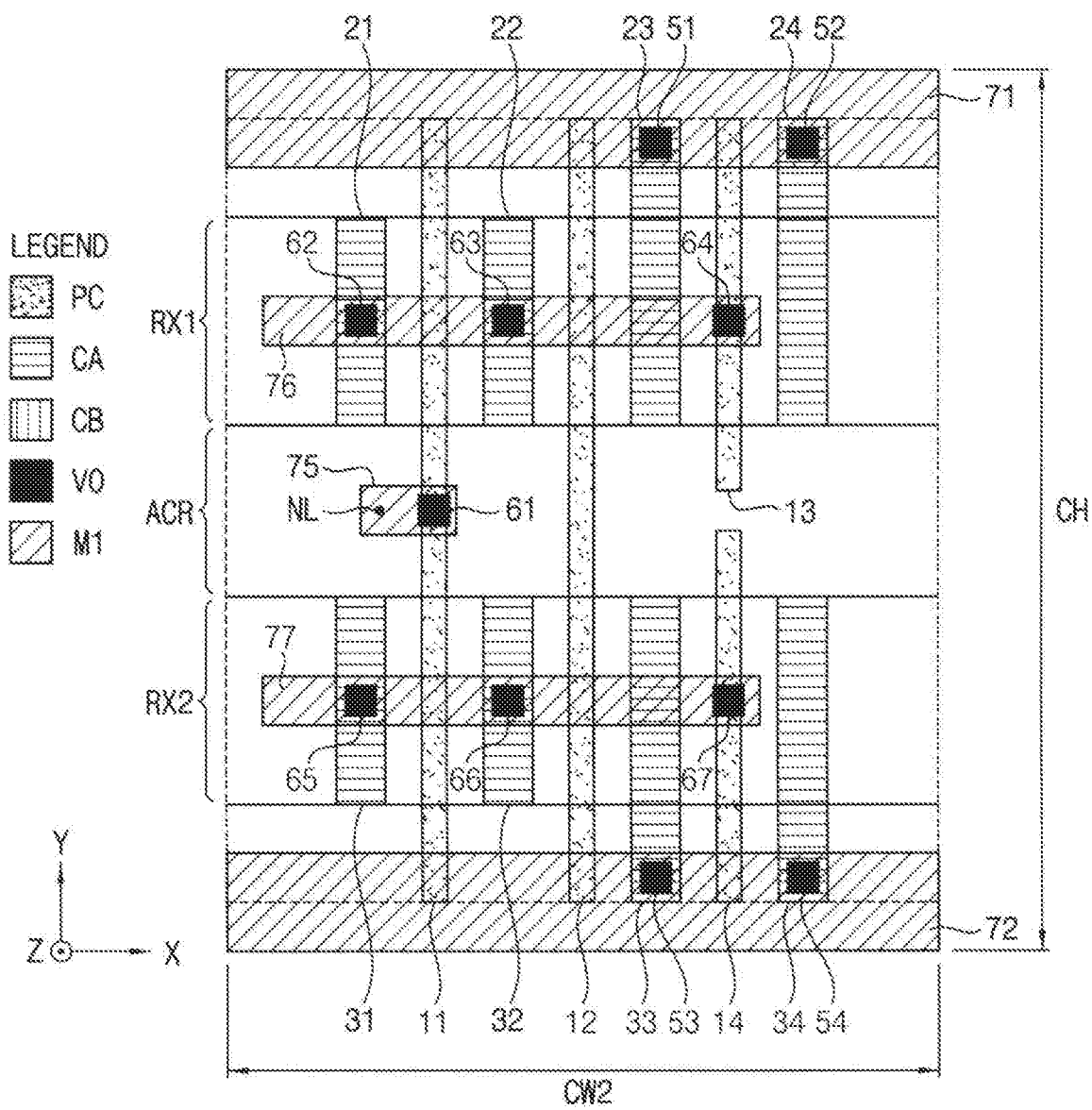

In some example embodiments, the different delay characteristics may be implemented by controlling the capacitance of the MOS capacitor using a parallel structure of FIGS. 13A and 13B and/or a serial structure of FIGS. 14A and 14B.

FIG. 13A illustrates a schematic of a load standard cell LSC2 including a plurality of PMOS transistors TP1 and TP2 and a plurality of NMOS transistors TN1 and TN2. FIG. 13A illustrates a non-limiting example of two PMOS transistors and two NMOS transistors for convenience of illustration, and the number of the transistors may be changed variously.

Referring to FIG. 13A, a source electrode and a drain electrode of a first PMOS transistor TP1 may be connected to a power supply voltage VDD and a source electrode and a drain electrode of a first NMOS transistor TN1 are connected to a ground voltage VSS. In the same way, a source electrode and a drain electrode of a second PMOS transistor TP2 may be connected to the power supply voltage VDD, and a source electrode and a drain electrode of a second NMOS transistor TN2 may be connected to the ground voltage VSS. A gate electrode of the first PMOS transistor TP1, a gate electrode of the second PMOS transistor TP2, a gate electrode of the first NMOS transistor TN1 and a gate electrode of the second NMOS transistor TN2 may be commonly connected to a load node NL for providing a delay. The PMOS transistors TP1 and TP2 and the NMOS transistors TN1 and TN2 connected in parallel as such may be provided as a single load standard cell LSC2 and included in a standard cell library.

FIG. 13B illustrates an example layout corresponding to the schematic of the load standard cell LSC2 of FIG. 13A. Referring to FIGS. 13A and 13B, the PMOS transistors TP1 and TP2 are formed in a first device area RX1 and the NMOS transistors TN1 TN2 are formed in a second device area RX2. In this case, the power supply voltage VDD may be provided through a first power rail 71 and the ground voltage VSS may be provided through a second power rail 72.

The source electrodes and the drain electrodes of the PMOS transistors TP1 and TP2 may be connected to the power supply voltage VDD through first contacts 21, 22, 23 and 24 and via contacts 51, 52, 53 and 54. The source electrodes and the drain electrodes of the NMOS transistors TN1 and TN2 may be connected to the ground voltage VSS through first contacts 31, 32, 33 and 34 and via contacts 55, 56, 57 and 58.

The common gate line 11 of the first PMOS transistor TP1 and the first NMOS transistor TN1 and the common gate line 13 of the second PMOS transistor TP2 and the second NMOS transistor TN2 may be connected to a wiring 75 through via contacts 61 and 62, and the wiring 75 corresponding to a load node NL may be connected to a delay node of another standard cell. A gate line 12 is a dummy gate line that is in a floated state.

FIG. 14A illustrates a schematic of a load standard cell LSC3 including a plurality of PMOS transistors TP1 and TP2 and a plurality of NMOS transistors TN1 and TN2. FIG. 14A illustrates a non-limiting example of two PMOS transistors and two NMOS transistors for convenience of illustration, and the number of the transistors may be changed variously.

Referring to FIG. 14A, a source electrode and a drain electrode of a first PMOS transistor TP1 may be connected to a gate electrode of a second PMOS transistor TP2, and a source electrode and a drain electrode of a second PMOS transistor TP2 may be connected to a power supply voltage VDD. A source electrode and a drain electrode of a first NMOS transistor TN1 may be connected to a gate electrode of the second NMOS transistor TN2 and a source electrode and a drain electrode of a second NMOS transistor TN2 are connected to a ground voltage VSS. A gate electrode of the first PMOS transistor TP1 and a gate electrode of the first NMOS transistor TN1 may be commonly connected to a load node NL for providing a delay. The PMOS transistors TP1 and TP2 and the NMOS transistors TN1 and TN2 connected in series as such may be provided as a single load standard cell LSC3 and included in a standard cell library.

FIG. 14B illustrates an example layout corresponding to the schematic of the load standard cell LSC3 of FIG. 14A. Referring to FIGS. 14A and 14B, the PMOS transistors TP1 and TP2 are formed in a first device area RX1 and the NMOS transistors TN1 TN2 are formed in a second device area RX2. In this case, the power supply voltage VDD may be provided through a first power rail 71 and the ground voltage VSS may be provided through a second power rail 72.

The source electrodes and the drain electrodes of the first PMOS transistor TP1 may be connected to the gate electrode of the second PMOS transistor TP2, that is, a gate line segment 13 through first contacts 21 and 22, via contacts 62, 63 and 64 and a wiring 76. The source electrode and the drain electrode of the second PMOS transistor TP2 may be connected to the power supply voltage VDD through first contacts 23 and 24 and via contacts 51 and 52.

The source electrodes and the drain electrodes of the first NMOS transistor TN1 may be connected to the gate electrode of the second NMOS transistor TN2, for example, a gate line segment 14 through first contacts 31 and 32, via contacts 65, 66 and 67 and a wiring 77. The source electrode and the drain electrode of the second NMOS transistor TN2 may be connected to the ground voltage VSS through first contacts 33 and 34 and via contacts 53 and 54.

The common gate line 11 of the first PMOS transistor TP1 and the first NMOS transistor TN1 may be connected to a wiring 75 through a via contact 61, and the wiring 75 corresponding to a load node NL may be connected to a delay node of another standard cell. A gate line 12 is a dummy gate line that is in a floated state.

Figure 15A:
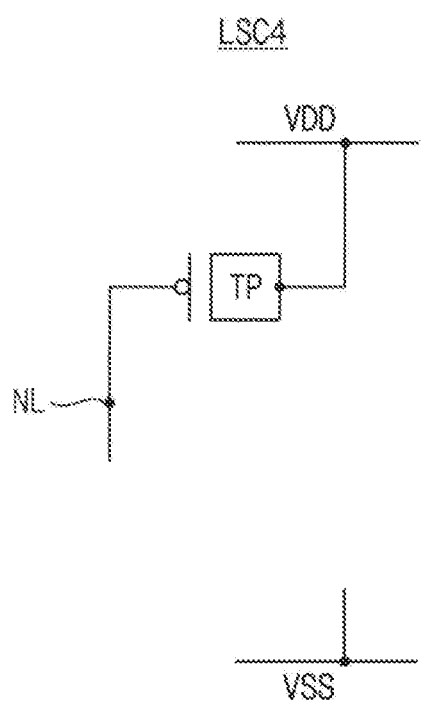

FIG. 15A illustrates a schematic of a load standard cell LSC4 including a PMOS transistor TP. Referring to FIG. 15A, a source electrode and a drain electrode of the PMOS transistor TP may be connected to a power supply voltage VDD, and a gate electrode of the PMOS transistor TP may be connected to a load node NL for providing a delay. The corresponding NMOS transistor according to a complementary MOS (CMOS) fabrication process may be remained in a dummy state, and its illustration is omitted in FIG. 15A. The PMOS transistor TP connected as such may be provided as a single load standard cell LSC4 and included in a standard cell library.

Figure 15B:
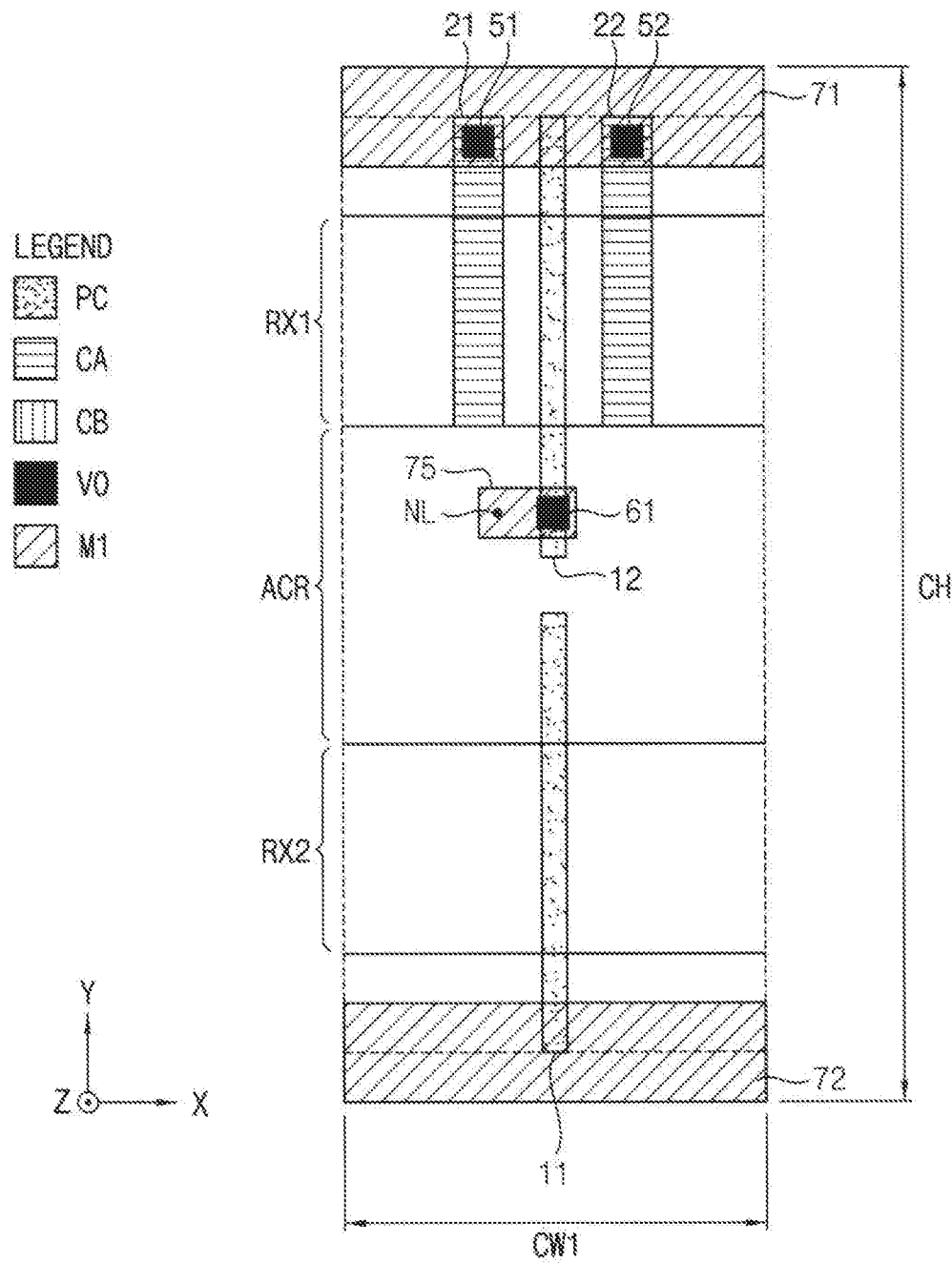

FIG. 15B illustrates an example layout corresponding to the schematic of the load standard cell LSC4 of FIG. 15A. Referring to FIGS. 15A and 15B, the PMOS transistor TP is formed in a first device area RX1 and the corresponding NMOS transistor in a second device area RX2 may be omitted. In this case, the power supply voltage VDD may be provided through a first power rail 71 and the ground voltage VSS may be provided through a second power rail 72.

The source electrode and the drain electrode of the PMOS transistor TP may be connected to the power supply voltage VDD through first contacts 21 and 22 and via contacts 51 and 52. The gate line segment 12 corresponding to the gate electrode of the PMOS transistor TP may be connected to a wiring 75 through a via contact 61 and the wiring 75 corresponding to a load node NL may be connected to a delay node of another standard cell. The other gate line segment 11 may be a dummy segment that is floated.

Figure 16A:
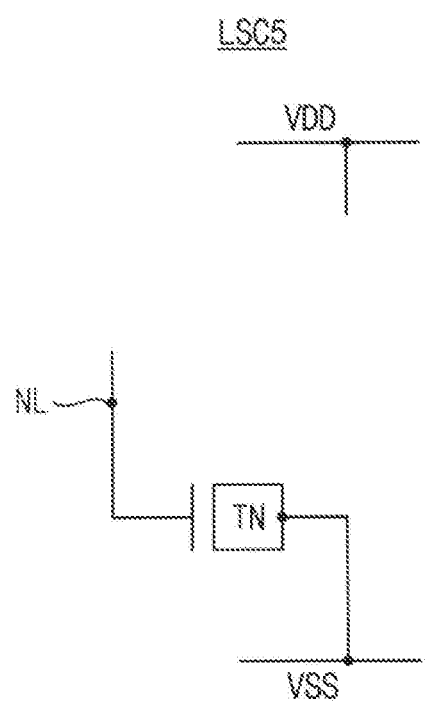

FIG. 16A illustrates a schematic of a load standard cell LSC5 including an NMOS transistor TN. Referring to FIG. 16A, a source electrode and a drain electrode of the NMOS transistor TN may be connected to a ground voltage VSS, and a gate electrode of the NMOS transistor TN may be connected to a load node NL for providing a delay. The corresponding PMOS transistor according to a CMOS fabrication process may be remained in a dummy state, and its illustration is omitted in FIG. 16A. The NMOS transistor TN connected as such may be provided as a single load standard cell LSC5 and included in a standard cell library.

Figure 16B:
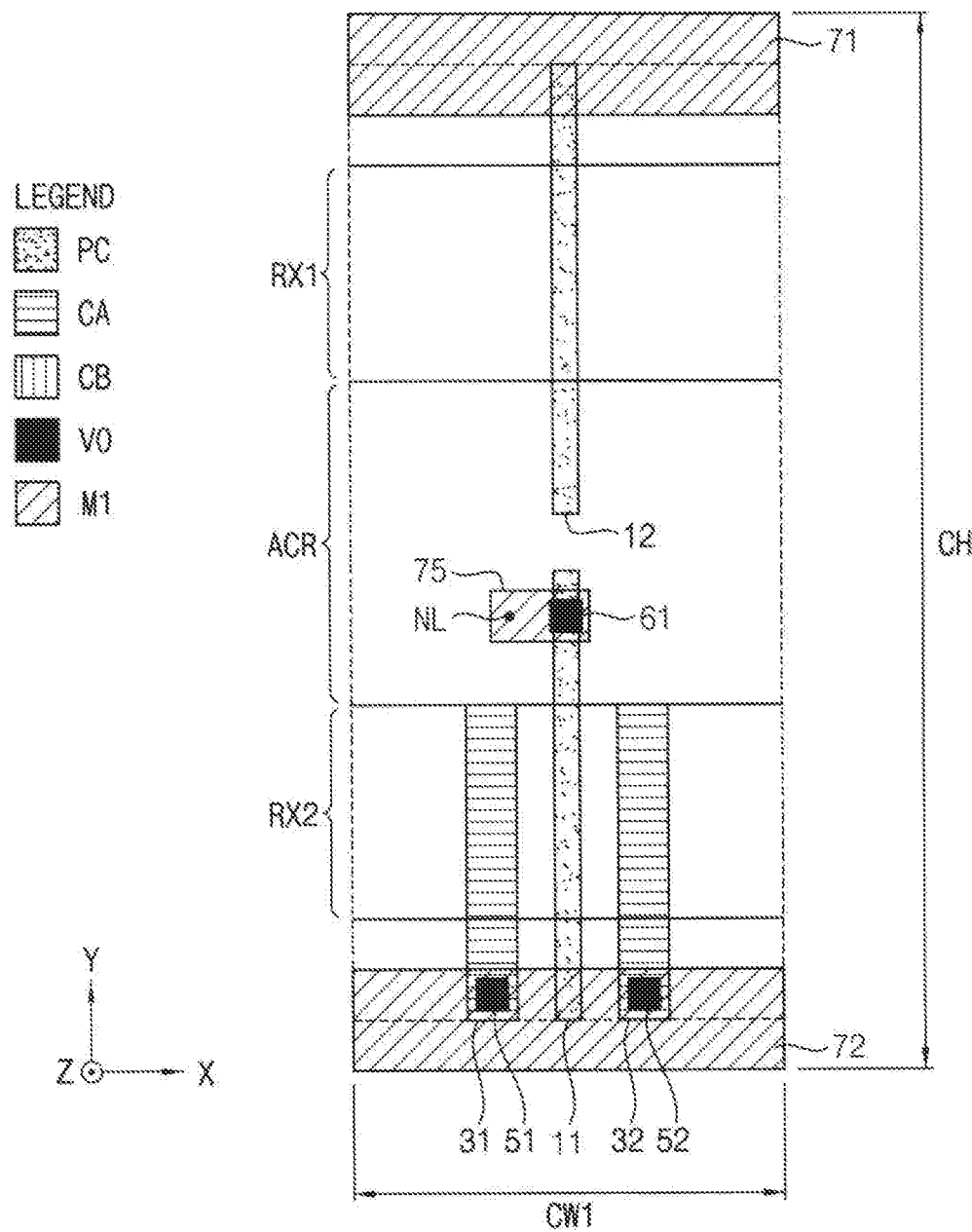

FIG. 16B illustrates an example layout corresponding to the schematic of the load standard cell LSC5 of FIG. 16A. Referring to FIGS. 16A and 16B, the NMOS transistor TN is formed in a second device area RX2 and the corresponding PMOS transistor in a first device area RX1 may be omitted. In this case, the power supply voltage VDD may be provided through a first power rail 71 and the ground voltage VSS may be provided through a second power rail 72.

The source electrode and the drain electrode of the NMOS transistor TN may be connected to the ground voltage VSS through first contacts 31 and 32 and via contacts 51 and 52. The gate line segment 11 corresponding to the gate electrode of the NMOS transistor TN may be connected to a wiring 75 through a via contact 61 and the wiring 75 corresponding to a load node NL may be connected to a delay node of another standard cell. The other gate line segment 12 may be a dummy segment that is floated.

The load standard cell LSC4 of FIG. 15A may cause a larger delay to a falling edge of a signal than a rising edge of the signal because the power supply voltage VDD is applied to an opposite electrode of the load node NL. In contrast, the load standard cell LSC5 of FIG. 16A may cause a larger delay to the rising edge of the signal than the falling edge of the signal because the ground voltage VSS is applied to an opposite electrode of the load node NL. A duty ratio of the signal of the integrated circuit may be adjusted using at least one of the load standard cells LSC4 and LSC5 having different delay characteristics.

Figure 17:
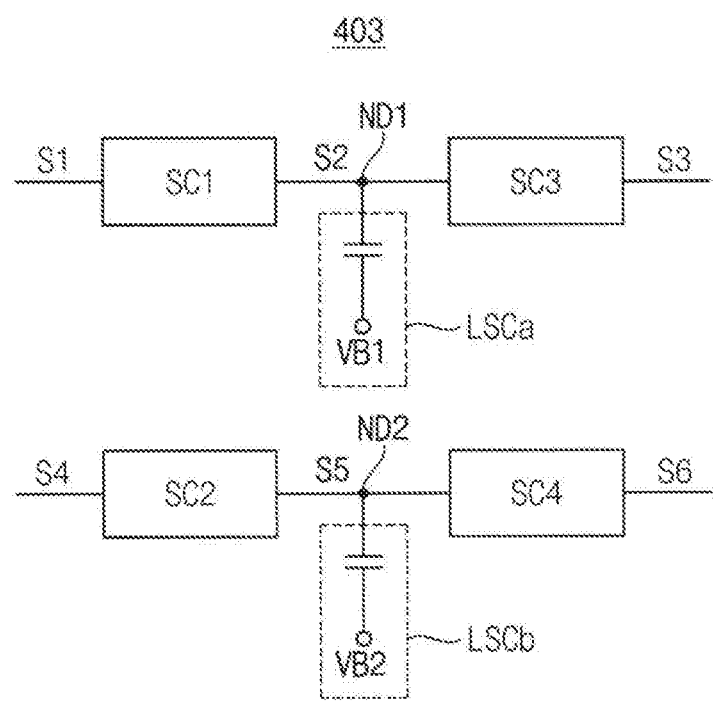
FIG. 17 is a block diagram illustrating an integrated circuit according to some example embodiments.

FIG. 17 is a block diagram illustrating an integrated circuit according to some example embodiments.

Referring to FIG. 17, an integrated circuit 403 may include a first logic standard cell SC1 including a first delay node ND1, a second logic standard cell SC2 including a second delay node ND2, a third logic standard cell SC3, a fourth logic standard cell SC4, a first load standard cell LSCa and a second load standard cell LSCb.

The first load standard cell LSCa may include a first load node providing a first delay and the first load node is connected to the first delay node ND1. The second load standard cell LSCb includes a second load node providing a second delay different from the first delay and the second load node is connected to the second delay node ND2. A first bias voltage VB1 may be applied to an opposite electrode of the first load node of the first load standard cell LSCa and a second bias voltage VB2 may be applied to an opposite electrode of the second load node of the second load standard cell LSCb.

The first logic standard cell SC1 may performs a logic operation on a first signal S1 to generate a second signal S2, and the third logic standard cell SC3 may perform a logic operation on the second signal S2 to generate a third signal S3. The second logic standard cell SC2 may performs a logic operation on a fourth signal S4 to generate a fifth signal S5, and the fourth logic standard cell SC4 may perform a logic operation on the fifth signal S5 to generate a sixth signal S6.

One of the first bias voltage VB1 and the second bias voltage VB2 may correspond to the power supply voltage VDD and the other of the first bias voltage VB1 and the second bias voltage VB2 may correspond to the ground voltage VSS. In this case, as described with reference to FIGS. 15A and 15B, one of the first load standard cell LSCa and the second load standard cell LSCb may provide a larger delay to a rising edge of a signal and the other of the first load standard cell LSCa and the second load standard cell LSCb may provide a larger delay to a falling edge of the signal.

FIGS. 18A and 18B are timing diagrams illustrating operations of the integrated circuit of FIG. 17.

Referring to FIGS. 17 and 18A, the first load standard cell LSCa may cause a larger delay to a falling edge of a signal than a rising edge of the signal. According to the delay characteristic of the first load standard cell LSCa, a falling time tF1 of the second signal S2 may be longer than a rising time tR1 of the second signal S2, and thus a delay tDF1 of a falling edge of the third signal S3 with respect to the first signal S1 may be larger than a delay tDR1 of a rising edge of the third signal S3 with respect to the first signal S1. If the first signal S1 has a duty ratio smaller than a value of 0.5, a duty ratio of the third signal S3 may be increased to approach the value of 0.5 using the first load standard cell LSCa.

Referring to FIGS. 17 and 18B, the second load standard cell LSCb may cause a larger delay to a rising edge of a signal than a falling edge of the signal. According to the delay characteristic of the second load standard cell LSCb, a rising time tR2 of the fifth signal S5 may be longer than a falling time tF2 of the fifth signal S5, and thus a delay tDR2 of a rising edge of the sixth signal S6 with respect to the fourth signal S4 may be larger than a delay tDF2 of a falling edge of the sixth signal S4 with respect to the fourth signal S4. If the fourth signal S4 has a duty ratio larger than a value of 0.5, a duty ratio of the sixth signal S6 may be decreased to approach the value of 0.5 using the second load standard cell LSCb.

As such, a duty ratio of a signal of the integrated circuit may be adjusted using at least one of the first load standard cell LSCa and the second load standard cell LSCb having the different delay characteristics.

Figure 19:
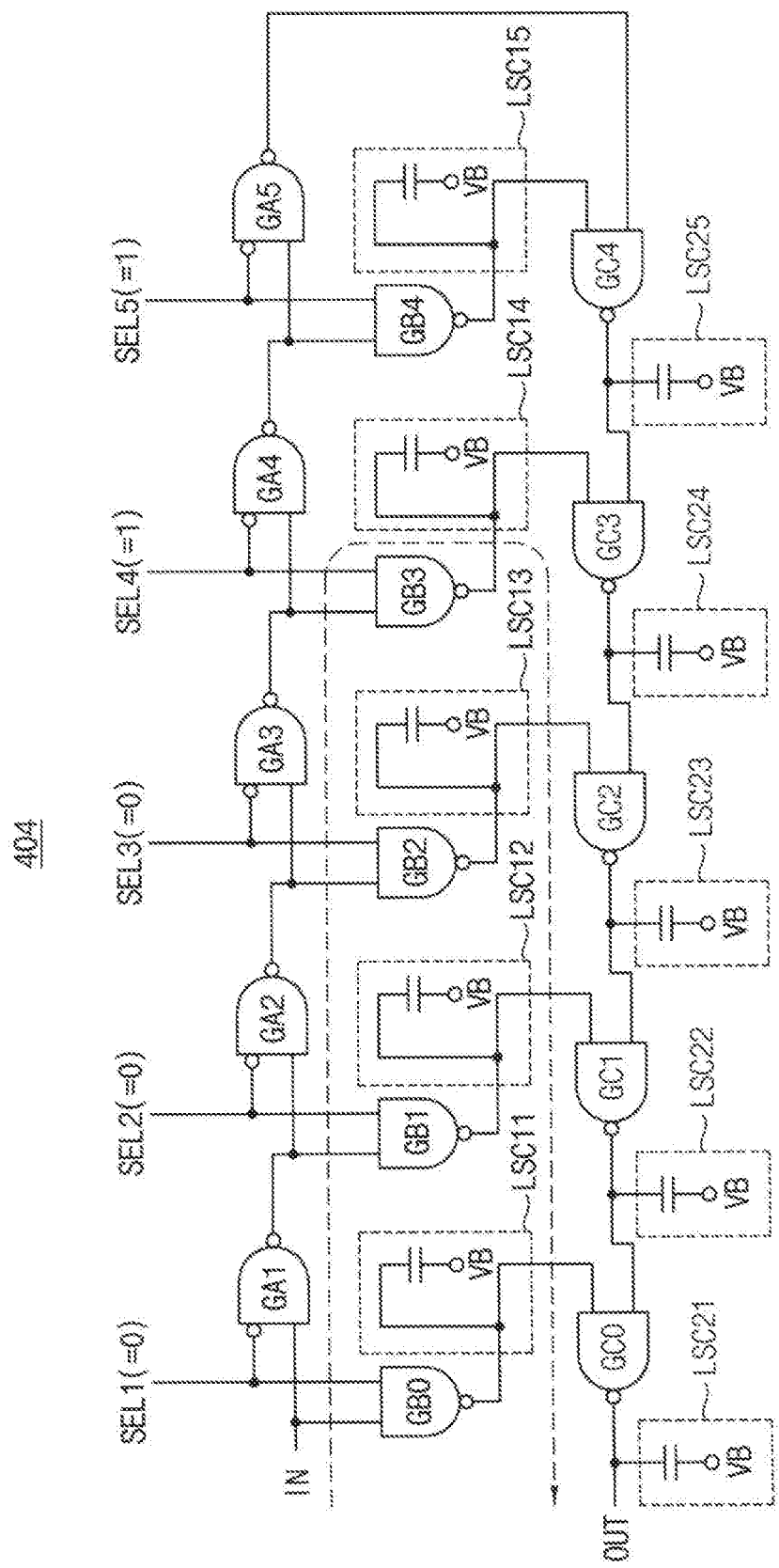
FIG. 19 is a block diagram illustrating an integrated circuit according to some example embodiments.

FIG. 19 is a block diagram illustrating an integrated circuit according to some example embodiments.

FIG. 19 illustrates an example embodiment of a digitally-controlled delay line as an example integrated circuit. The digitally-controlled delay line has five stages controlled by five-bit selection signals SEL1~SEL5 is illustrated in FIG. 19 for convenience of illustration, but the number of stages in the delay line may be determined variously.

Referring to FIG. 19, an integrated circuit 404 may include a plurality of input NAND gates GA1~GA5, a plurality of intermediate NAND gates GB0~GB4, a plurality of output NAND gates GC0~GC4, a plurality of intermediate load standard cells LSC12~LSC15 and a plurality of output load standard cells LSC21~LSC25.

Each of the plurality of input NAND gates GA1~GA5 may perform a NAND operation on each of inversion signals of the selection signals SEL1~SEL5 and may output of the previous input NAND gate. The first input NAND gate GA1 receives an input signal IN. Each of the plurality of intermediate NAND gates GB0~GB4 may perform a NAND operation on each of the selection signals SEL1~SEL5 and may output the corresponding input NAND gate. The first intermediate NAND gate GB0 receives the input signal IN. Each of the plurality of output NAND gates GC0~GC4 performs a NAND operation on output of the corresponding intermediate NAND gate and output of the previous output NAND gate. The first output NAND gate GC0 provides an output signal OUT that is delayed finally.

The selection signals SEL1~SEL5 may form a thermometric code. For example, as illustrated in FIG. 19, the first, second and third selection signals SEL1, SEL2 and SEL3 may have values of "0" and the fourth and fifth selection signals SEL4 and SEL5 may have values of "1". In this case, the input signal IN passes through the three input NAND gates GA1, GA2 and GA3, the one intermediate NAND gate GB3 and the four output NAND gates GC3, GC2, GC1 and GC0 to provide the finally delayed output signal OUT.

Each output of the input NAND gates GA1~GA5 is provided as inputs of the two NAND gates, that is, the next input NAND gate and the corresponding intermediate NAND gate. In contrast, each output of the intermediate NAND gates GB0~GA4 is provided as an input of the one NAND gate, that is, the corresponding output NAND gate. With such mismatch of the output loads, the delay mismatch may cause degeneration of operational characteristics of the integrated circuit 404. According to some example embodiments, the plurality of intermediate load standard cells LSC11~LSC15 may be connected to the output nodes of the plurality of intermediate NAND gates GB0~GB4 to implement delay matching. In the same way, the plurality of output load standard cells LSC21~LSC25 may be connected to the output nodes of the plurality of output NAND gates GC0~GC4.

Figure 20:
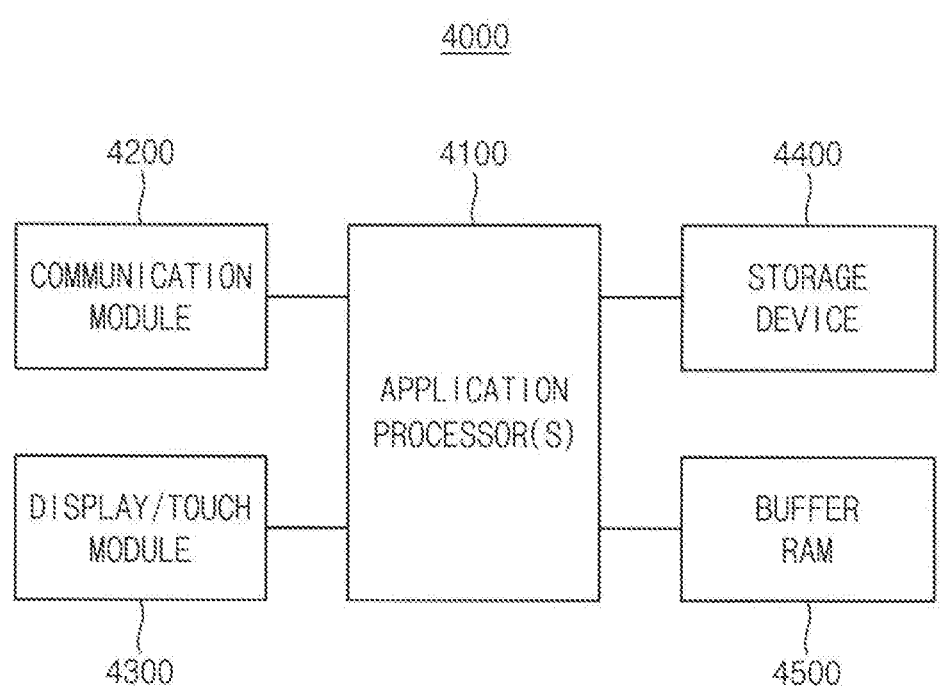
FIG. 20 is a block diagram illustrating a mobile device according to some example embodiments.

FIG. 20 is a block diagram illustrating a mobile device according to some example embodiments.

Referring to FIG. 20, a mobile device 4000 may include at least one application processor 4100, a communication module 4200, a display/touch module 4300, a storage device 4400, and a buffer RAM 4500.

The application processor 4100 may control operations of the mobile device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be or include an embedded multimedia card (eMMC), a solid state drive (SSD, a universal flash storage (UFS) device, etc. The storage device 4400 may perform caching of the mapping data and the user data as described above.

The buffer RAM 4500 may temporarily store data used for processing operations of the mobile device 4000. For example, the buffer RAM 4500 may be or include volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the mobile device 4000 may include at least one load standard cell according to some example embodiments. As described above, a design of the load standard cell may be included in the standard cell library and integrated circuits included in the mobile device 4000 may be designed through automatic placement and routing by a design tool.

As described above, the integrated circuit and the method of designing the integrated circuit according to some example embodiments may enhance design efficiency and performance of the integrated circuit by designing the integrated circuit with delay matching and duty ratio adjustment using the load standard cell.

Inventive concepts may be applied to any electronic devices and systems. For example, the present inventive concept may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

By designing and/or fabricating an integrated circuit to include load standard cells having different delay characteristics, a design efficiency and performance of the integrated circuit may be enhanced.

Example embodiments are described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particular manner, a function or operation specified in a specific block may be performed differently from the flow specified in a flowchart, flow diagram, etc. For example, functions or operations illustrated as being performed serially in two consecutive blocks may actually be performed concurrently, simultaneously, or in some cases be performed in reverse order.

Units and/or devices according to one or more example embodiments may be implemented using hardware, a combination of hardware and software, or storage media storing software. Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

The foregoing is illustrative of some example embodiments and is not to be construed as limiting thereof.

What is claimed is:

1. A method of designing an integrated circuit, comprising:
receiving input data defining an integrated circuit;
providing, in a standard cell library, a plurality of load standard cells having different delay characteristics, the load standard cells including a transistor having a source and a drain, the source and the drain directly connected to one another;
performing placement and routing based on the input data and the standard cell library; and
generating output data defining the integrated circuit based on a result of the placement and the routing,
wherein the providing the plurality of load standard cells includes providing at least one load standard cell capable of controlling a capacitance value of the transistor by adjusting a density of impurities implanted into a gate electrode of the transistor.

2. The method of claim 1, wherein providing the plurality of load standard cells includes:
providing, as the plurality of load standard cells, a plurality of standard cells of capacitors having different capacitance values.

3. The method of claim 1, wherein the providing the plurality of load standard cells further includes:
controlling a capacitance value of the transistor by adjusting a size of the transistor.

4. The method of claim 1, wherein the providing the plurality of load standard cells includes:
connecting a plurality of MOS capacitors in series; and
providing the plurality of MOS capacitors connected in series as a single load standard cell.

5. The method of claim 1, wherein the providing the plurality of load standard cells includes:
connecting a plurality of MOS capacitors in parallel; and
providing the plurality of MOS capacitors connected in parallel as a single load standard cell.

6. The method of claim 1, wherein the providing the plurality of load standard cells includes:
connecting a source electrode and a drain electrode of a P-channel metal oxide semiconductor (PMOS) transistor to a power supply voltage;
connecting a source electrode and a drain electrode of an N-channel metal oxide semiconductor (NMOS) transistor to a ground voltage;
connecting a gate electrode of the PMOS transistor and a gate electrode of the NMOS transistor to a load node for providing a delay; and
providing the PMOS transistor and the NMOS transistor as a single load standard cell.

7. The method of claim 1, wherein the providing the plurality of load standard cells includes:

providing a first load standard cell configured to cause a larger delay to a falling edge of a signal than to a rising edge of the signal; and
providing a second load standard cell configured to cause a larger delay to the rising edge of the signal than to the falling edge of the signal.

8. The method of claim 7, wherein the performing the placement and the routing includes:
adjusting a duty ratio of a signal of the integrated circuit using at least one of the first load standard cell and the second load standard cell.

9. The method of claim 1, wherein the providing the plurality of load standard cells includes:
connecting a source electrode and a drain electrode of a PMOS transistor to a power supply voltage;
connecting a gate electrode of the PMOS transistor to a first load node for providing a delay; and
providing the PMOS transistor as a first load standard cell.

10. The method of claim 9, wherein the providing the plurality of load standard cells further includes:
connecting a source electrode and a drain electrode of an NMOS transistor to a power supply voltage;
connecting a gate electrode of the NMOS transistor to a second load node for providing a delay; and
providing the NMOS transistor as a second load standard cell.

11. The method of claim 10, wherein the performing the placement and the routing includes:
adjusting a duty ratio of a signal of the integrated circuit using at least one of the first load standard cell and the second load standard cell.

12. The method of claim 1, wherein the performing the placement and the routing includes:
determining a delay difference between a first signal path of the integrated circuit and a second signal path of the integrated circuit;
placing a selected load standard cell among the plurality of load standard cells, the selected load standard cell having a load node, the selected load standard cell providing a delay corresponding to the delay difference; and
routing the selected load standard cell such that the load node of the selected load standard cell is connected to the one of the first signal path and the second signal path having a smaller delay.

13. The method of claim 1, further comprising:
fabricating the integrated circuit using at least one photomask, the at least one photomask being based on the output data.

14. The method of claim 1, wherein the providing the plurality of load standard cells includes at least one of:
connecting the source electrode and drain electrode of the transistor to a power supply voltage and connecting the gate electrode of the transistor to a dummy floating node, the transistor being a PMOS transistor, or
connecting the source electrode and drain electrode of the transistor to a ground supply voltage and connecting the gate electrode of the transistor to the dummy floating node, the transistor being an NMOS transistor.

15. An integrated circuit comprising:
a logic standard cell including a delay node with an associated a delay; and
a load standard cell including a load node connected to the delay node, the load standard cell configured to provide the associated delay, the load standard cell including a transistor having a source and a drain, the source and the drain shorted together, wherein the associated delay of the load standard cell is based on a density of impurities implanted into a gate electrode of the transistor, and the load standard cell is capable of controlling a capacitance value of the transistor by adjusting the density of the impurities implanted into the gate electrode of the transistor.

16. The integrated circuit of claim 15, wherein the load standard cell includes:
   a P-channel metal oxide semiconductor (PMOS) transistor having a gate electrode connected to the load node, and a source electrode and a drain electrode connected to a power supply voltage; and
   an N-channel metal oxide semiconductor (NMOS) transistor having a gate electrode connected to the load node, and a source electrode and a drain electrode connected to a ground voltage.

17. The integrated circuit of claim 15, wherein the load standard cell includes at least one of:
   a PMOS transistor having a gate electrode connected to the load node, and a source electrode and a drain electrode connected to a power supply voltage; and
   an NMOS transistor having a gate electrode connected to the load node, and a source electrode and a drain electrode connected to a ground voltage.

18. The integrated circuit of claim 15, wherein the load standard cell includes at least one of:
   a first load standard cell configured to cause a larger delay to a falling edge of a signal than to a rising edge of the signal; and
   a second load standard cell configured to cause a larger delay to the rising edge of the signal than to the falling edge of the signal,
   wherein at least one of the first load standard cell and the second load standard cell is configured to adjust a duty ratio of a signal of the integrated circuit.

19. An integrated circuit comprising:
   a first logic standard cell including a first delay node;
   a second logic standard cell including a second delay node;
   a first load standard cell including a first load node providing a first delay, the first load node connected to the first delay node; and
   a second load standard cell including a second load node providing a second delay different from the first delay, the second load node connected to the second delay node, wherein
   the first load standard cell includes a first transistor, the first transistor having a first source node and a first drain node in common with the first source node,
   the second load standard cell includes a second transistor, the second transistor having a second source node and a second drain node in common with the second source node,
   a first amount of impurities implanted into a first gate electrode of the first transistor is different from a second amount of impurities implanted into a second gate electrode of the second transistor, and
   the second load standard cell is capable of controlling a second capacitance value of the second transistor by adjusting a second density of impurities implanted into the second gate electrode of the second transistor.

20. The integrated circuit of claim 19, wherein at least one of (i) the first source node and the first drain node of are connected to at least one of a power supply or a ground voltage, or (ii) the second source node and the second drain node are connected to at least one of the power supply voltage or the ground voltage.

* * * * *